(12) United States Patent
Nishio et al.

(10) Patent No.: US 9,524,756 B2
(45) Date of Patent: Dec. 20, 2016

(54) APPARATUSES AND METHODS FOR COUPLING SEMICONDUCTOR DEVICES OF A MEMORY MODULE IN A MEMORY SYSTEM

(71) Applicant: Micron Technology, Inc., Boise, ID (US)

(72) Inventors: Yoji Nishio, Tokyo (JP); Tadaaki Yoshimura, Tokyo (JP); Koji Matsuo, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 14/169,659

(22) Filed: Jan. 31, 2014

(65) Prior Publication Data

US 2014/0233335 A1    Aug. 21, 2014

(30) Foreign Application Priority Data

Feb. 18, 2013 (JP) ................................ 2013-028770

(51) Int. Cl.

| | |
|---|---|
| *G11C 5/02* | (2006.01) |
| *G11C 5/00* | (2006.01) |
| *G11C 5/06* | (2006.01) |
| *G11C 8/00* | (2006.01) |
| *G11C 5/04* | (2006.01) |
| *G11C 29/02* | (2006.01) |
| *G11C 29/44* | (2006.01) |
| *G11C 7/10* | (2006.01) |
| *G11C 29/04* | (2006.01) |

(52) U.S. Cl.
CPC .............. *G11C 5/04* (2013.01); *G11C 7/1057* (2013.01); *G11C 29/025* (2013.01); *G11C 29/44* (2013.01); *G11C 2029/0409* (2013.01)

(58) Field of Classification Search
USPC .... 365/51, 52, 63, 230.03, 233.13; 361/789; 710/100; 714/57
See application file for complete search history.

(56) References Cited

U.S. PATENT DOCUMENTS

| | | | | |
|---|---|---|---|---|
| 6,438,014 | B2 * | 8/2002 | Funaba et al. .................. | 365/52 |
| 6,661,690 | B2 * | 12/2003 | Moriarty et al. ............... | 365/52 |
| 6,873,533 | B2 * | 3/2005 | Shibata et al. .................. | 365/52 |
| 6,937,494 | B2 * | 8/2005 | Funaba et al. .................. | 365/52 |
| 6,978,328 | B1 * | 12/2005 | Osaka et al. .................... | 365/52 |

(Continued)

FOREIGN PATENT DOCUMENTS

JP          2002-023901 A       1/2002

*Primary Examiner* — Trong Phan
(74) *Attorney, Agent, or Firm* — Dorsey & Whitney LLP

(57) ABSTRACT

A system includes memory chips mounted on a memory module each having an alert terminal that notifies that the memory chip has detected a predetermined error. The memory module has a first transmission line connected to alert terminals of memory chips, output terminal being connected to one end of the first transmission line, and a first termination resistor having an end connected to another end of the first transmission line. The system further includes a second transmission line having an end connected to the alert terminal and another end connected to a controller and a third transmission line having an end connected to a first input terminal on the memory module and a second end line and a second end having a voltage different from a voltage of another end of the first termination resistor.

19 Claims, 36 Drawing Sheets

(56) References Cited

U.S. PATENT DOCUMENTS

| | | | |
|---|---|---|---|
| 7,035,116 B2* | 4/2006 | Kuzmenka | 361/789 |
| 7,529,112 B2* | 5/2009 | Dreps et al. | 365/51 |
| 8,539,126 B2* | 9/2013 | Greeff et al. | 710/100 |
| 2014/0013168 A1* | 1/2014 | Bains et al. | |

* cited by examiner

Fig.15

| VDDQ | | Voltage(V) |
|---|---|---|
| Fast condition 1.26V | VIHmin | 1.025 |
| | Vref | 0.945 |
| | VILmax | 0.865 |
| Slow condition 1.14V | VIHmin | 0.935 |
| | Vref | 0.855 |
| | VILmax | 0.775 |

Fig.16

| VDDQ | | Ron(ohm) | VA1(V) | DC Low level margin VILmax − VA1 (V) |
|---|---|---|---|---|
| 1.26V | case1 | 40.8 | 0.566 | 0.299 |
| | case2 | 27.2 | 0.444 | 0.421 |
| 1.14V | case3 | 40.8 | 0.512 | 0.263 |
| | case4 | 27.2 | 0.402 | 0.373 |

APPARATUSES AND METHODS FOR COUPLING SEMICONDUCTOR DEVICES OF A MEMORY MODULE IN A MEMORY SYSTEM

BACKGROUND OF THE INVENTION

1. Field of the Invention

The present invention relates to semiconductor devices and systems.

2. Description of the Related Art

A technique that connects a termination resistor to the end of a transmission line in a memory module and thereby reduces reflections of signals therein is disclosed in Patent Literature 1 (JP2002-23901A, Publication).

In recent years, memory devices provided with various functions besides an information storage function have been released. For example, a DDR4 DRAM (Double Data Rate 4 Dynamic Random Access Memory), which is a memory module, is newly provided with an alert signal output function that outputs errors such as a CRC (Cyclic Redundancy Check) error and a parity check error to the outside of the DRAM. Such a DDR4 DRAM is provided with an alert pin that is an output terminal that outputs an alert signal.

FIG. 1 is a schematic diagram showing an example of connections of a memory module substrate on which a plurality of DRAMs each having an alert signal output function are mounted.

As shown in FIG. 1, in memory module 1000 on which DRAMs 2000-1 to 2000-9 are mounted, a signal line for a CA (Command and Address) signal and a CTRL (Control) signal that are input from the outside of memory module 1000 are connected in series to input terminals 1002 of DRAMs 2000-1 to 2000-9. This signal line is also connected to termination resistor 3000 preceded by DRAM 2000-9 that is the farthest from input terminal 1002 of memory module 1000. On the other hand, a signal line for alert signals that DRAMs 2000-1 to 2000-9 output so as to notify the remote controller that an error occurs is connected in series to alert terminals of DRAMs 2000-1 to 2000-9. Thus, the alert signals that are input from DRAMs 2000-1 to 2000-9 are output from output terminal 1001 of memory module 1000 to the memory controller.

However, if the foregoing signal line is long, a problem in which alert signals reflect on the signal line will occur. For example, in the connections shown in FIG. 1, if an alert signal is output from the alert terminal of DRAM 2000-9, the alert signal propagates not only in the direction of output terminal 1001, but also in the direction of DRAM 2000-8. As a result, the alert signal that propagates in the direction of DRAM 2000-8 reflects at DRAM 2000-1 and then propagates in the direction of output terminal 1001 of memory module 1000. Thus, the alert signals that are output from output terminal 1001 get distorted. Moreover, SODIMMs (Small Outline Dual In-Line Memory Modules) have various system structures such as 1 DPC (DIMM Per Channel) and 2DPC and thereby reflections of alert signals and DC Low levels become complicated.

SUMMARY

In one embodiment, there is provided a semiconductor device that includes:

a plurality of memory chips each having an alert terminal that notifies the outside that the memory chip has detected a predetermined error; and a memory module on which the plurality of memory chips are mounted and that has a first transmission line connected to the alert terminal of each of the plurality of memory chips, an alert signal output terminal connected to one end of the first transmission line, and a first termination resistor connected to another end of the first transmission line.

In another embodiment, there is provided a system that includes:

a plurality of memory chips each having an alert terminal that notifies the outside that the memory chip has detected a predetermined error; and a memory module on which the plurality of memory chips are mounted and that has a first transmission line connected to the alert terminal of each of the plurality of memory chips, an alert signal output terminal connected to one end of the first transmission line, and a first termination resistor connected to another end of the first transmission line;

a second transmission line having a first end and a second end, the first end being connected to the alert signal output terminal; and a controller connected to the second end of the second transmission line.

As described above, according to the present invention, a plurality of memory chips each have an alert terminal that notifies the outside that the memory chip has detected a predetermined error. The plurality of memory chips are mounted on a memory module. The memory module has a first transmission line connected to the alert terminal of each of the plurality of memory chips, an alert signal output terminal connected to one end of the first transmission line, and a first termination resistor connected to another end of the first transmission line. Thus, distortions of waveforms of alert signals that are output from the memory module can be reduced.

BRIEF DESCRIPTION OF DRAWINGS

The above features and advantages of the present invention will be more apparent from the following description of certain preferred embodiments taken in conjunction with the accompanying drawings, in which:

FIG. 15 is a table showing the relationship between voltages and conditions;

FIG. 16 is a table showing the relationship between VA1 and Low level margin values calculated in various conditions;

DETAILED DESCRIPTION OF THE PREFERRED EMBODIMENTS

Next, with reference to the accompanying drawings, embodiments of the present invention will be described.

Figure 1:
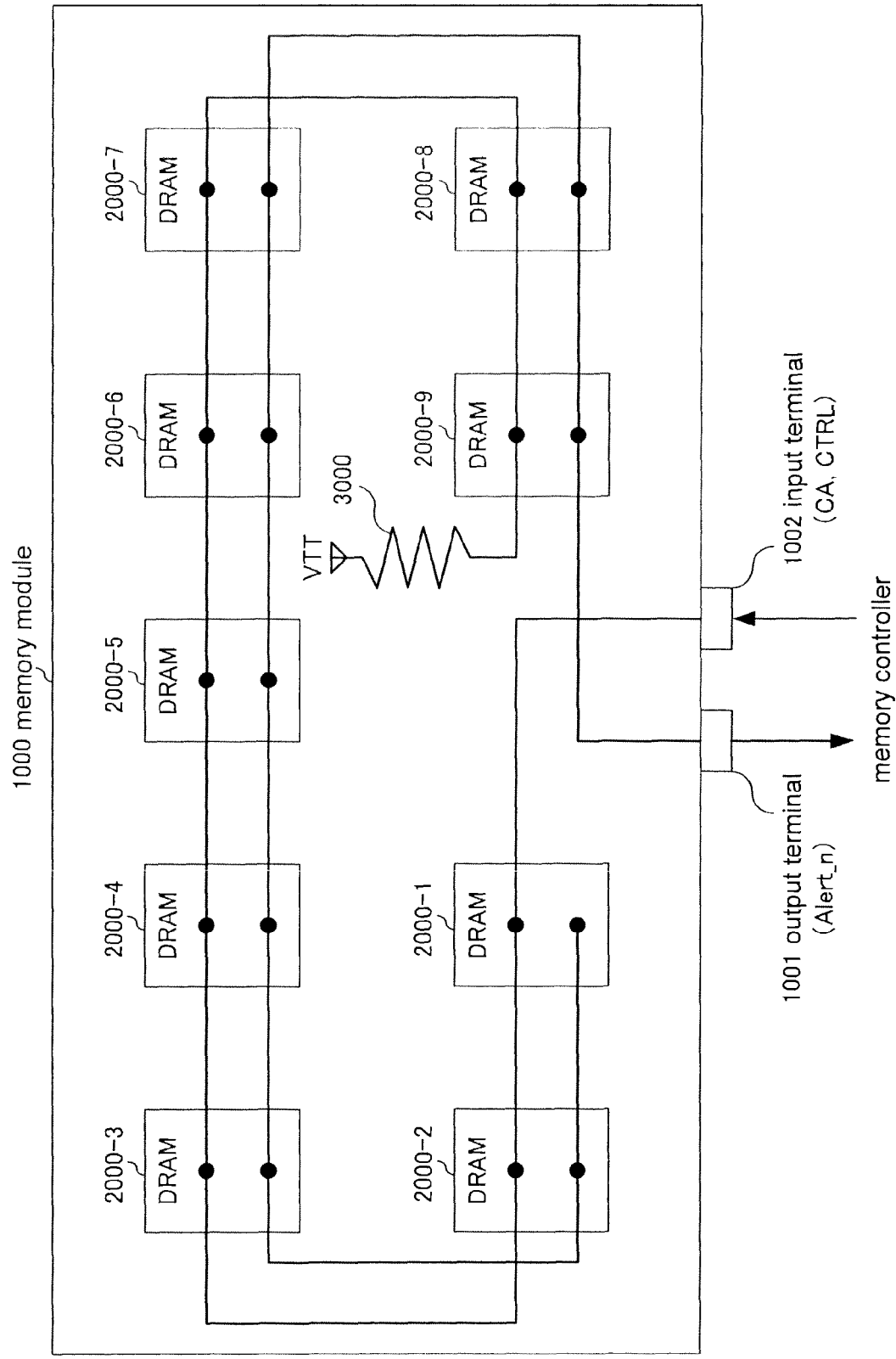
FIG. 1 is a schematic diagram exemplifying connections of a memory module substrate on which a plurality of DRAMs each of which is provided with an alert signal output function are mounted.
Figure 2:
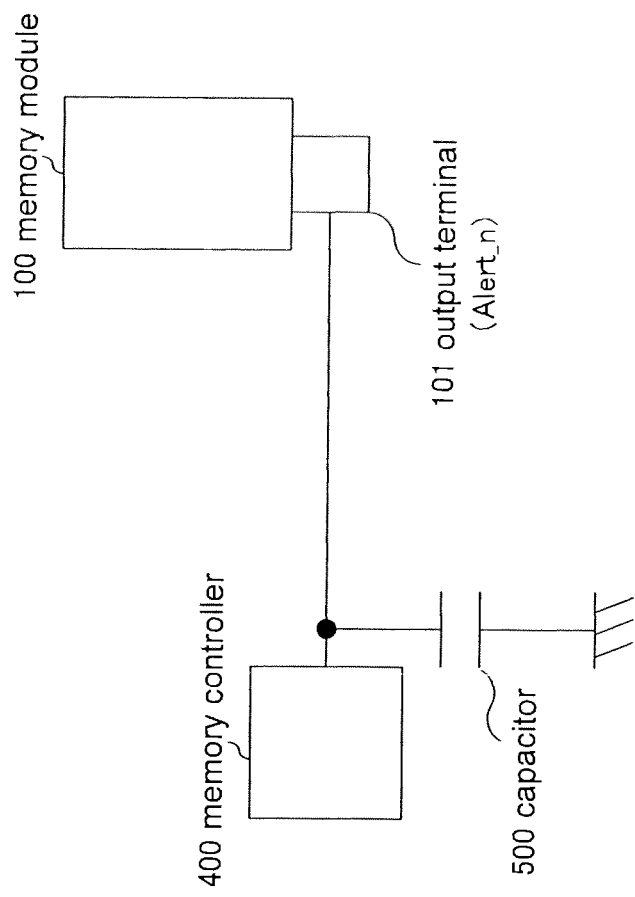
FIG. 2 is a schematic diagram showing a semiconductor device according to an embodiment of the present invention.

FIG. 2 shows a semiconductor device according to an embodiment of the present invention. The semiconductor device is comprised of memory module 100, memory controller (controller) 400 that controls memory module 100, and capacitor 500. Output terminal 101 of memory module 100 is connected to memory controller 400. An alert signal (Alert_n) that is output from a DRAM mounted on memory module 100 is output to memory controller 400 through output terminal 101. A transmission line 800 that connects memory module 100 and memory controller 400 is grounded through capacitor 500 in the vicinity of memory controller 400.

First Embodiment

First, memory module 100 that is an SODIMM (Small Outline Dual In-Line Memory Module) will be described. Memory controller 400 and two memory modules are connected in a structure so-called MoBo (Mother Board) Fly-by Topology.

Figure 3:
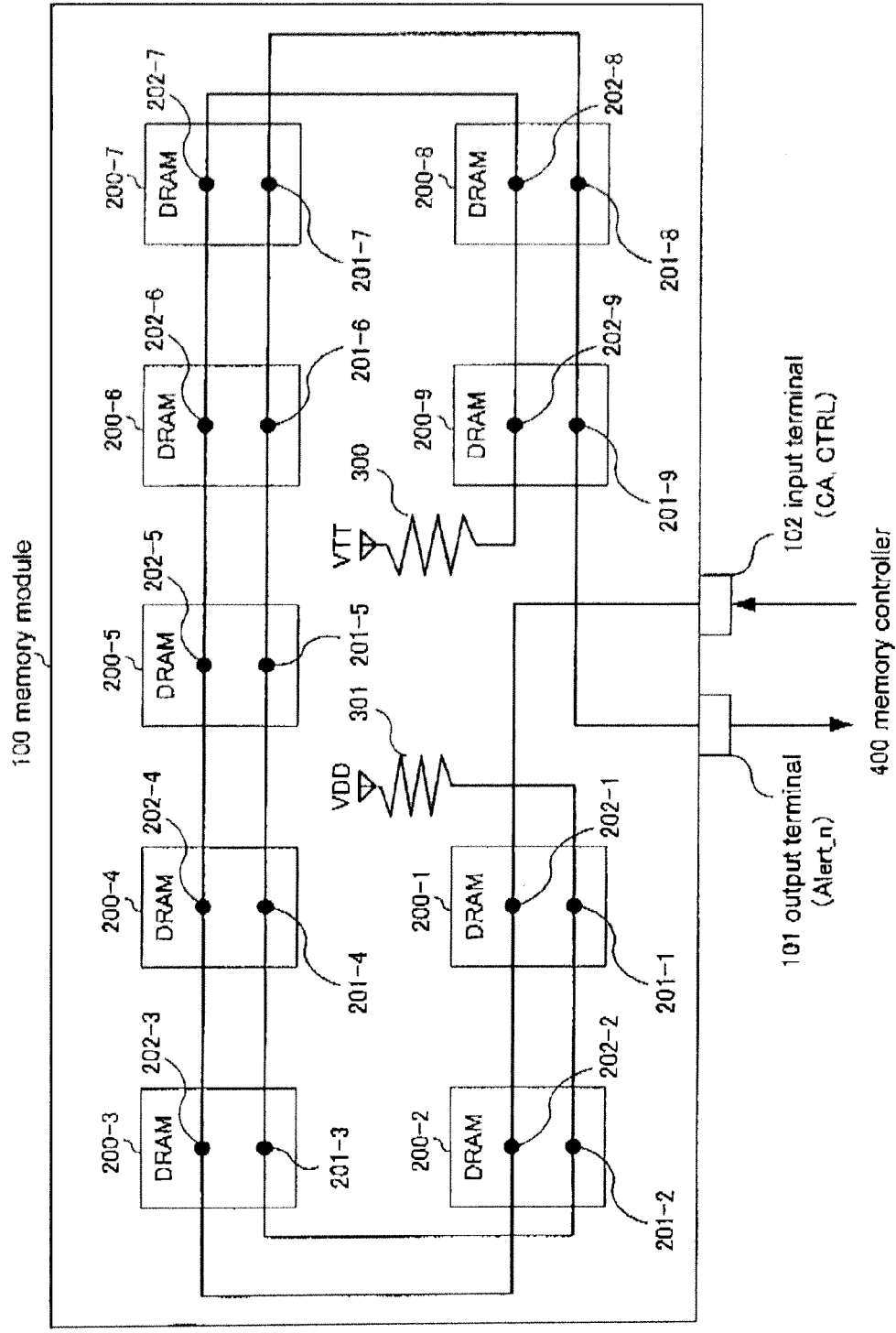
FIG. 3 is a schematic diagram showing the internal structure of memory modules shown in FIG. 2, in which the memory modules are SODIMMs.

As shown in FIG. 3, a plurality of memory chips DRAMs 200-1 to 200-9 are mounted on memory module 100 shown in FIG. 2. In addition, memory module 100 has input terminal 102 that inputs a CA (Command and Address) signal and a CTRL (Control) signal that are output from memory controller 400. In addition, memory module 100 has output terminal 101 that outputs alert signals that are output from DRAMs 200-1 to 200-9 to memory controller 400. The alert signals are signals that notify memory controller 400 that DRAMs 200-1 to 200-9 detect predetermined errors. Input terminal 102 and control terminals 202-1 to 202-9 of DRAMs 200-1 to 200-9 are connected in series. Input terminal 102 is connected to termination resistor 300 preceded by DRAM 200-9 that is the farthest from input terminal 102 on the connection line (transmission line). One end of termination resistor 300 is connected to control terminal 202-9, whereas the other end of termination resistor 300 is connected to termination voltage VTT. On the other hand, output terminal 101 and alert terminals 201-1 to 201-9 of DRAMs 200-1 to 200-9 are connected in series. Output terminal 101 is connected to termination resistor 301 preceded by DRAM 200-1 that is the farthest from output terminal 101 on the connection line (transmission line). One end of termination resistor 301 is connected to alert terminal 201-1, whereas the other end of termination resistor 301 is connected to power supply voltage VDD.

Since the CA signal is push-pull driven, it is connected to voltage VTT=½ VDD. Voltage ½ VDD is supplied from the mother board through the ½ VDD supply connector of the module. On the other hand, since alert signal is open-drain driven, it is connected to voltage VDD. VDD is supplied from the mother board through the VDD supply connector of the module. The resistance of termination resistor 301 for the alert signal is generally greater than the resistance of termination resistor 300 for the CA signal.

In the structure shown in FIG. 3, it is assumed that the number of DRAMs is nine. According to the present invention, the number of DRAMs is not limited to nine. This assumption will be applied to the following description.

Figure 4A:
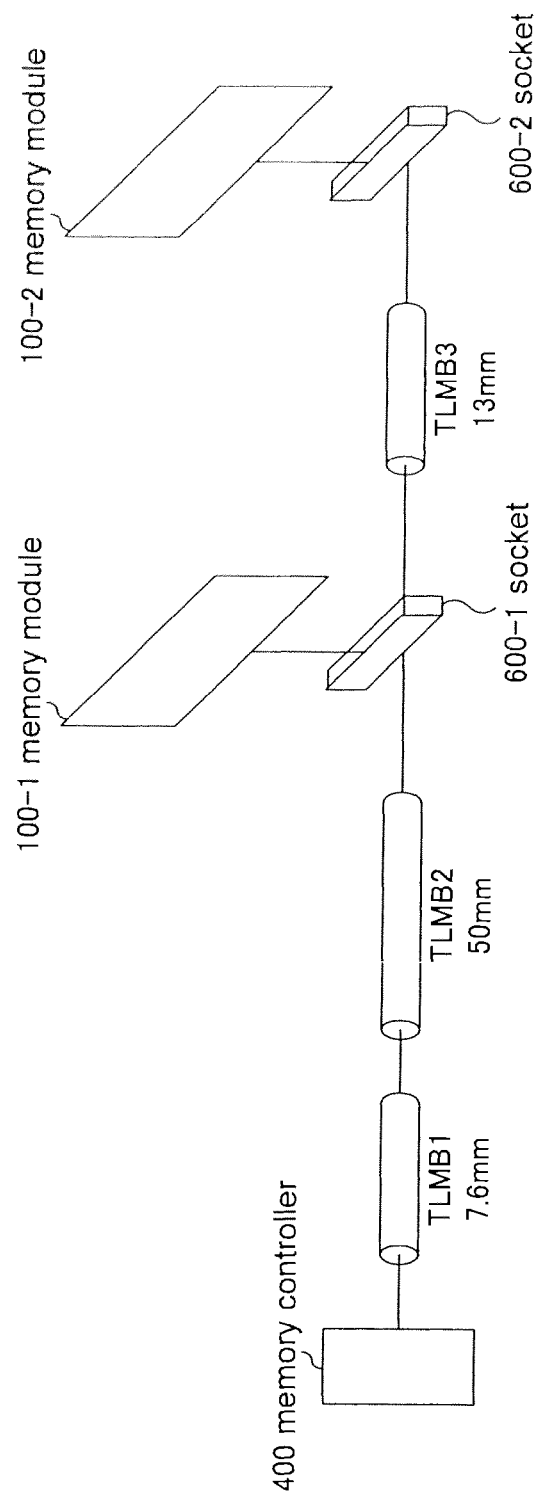
FIG. 4A is a schematic diagram showing the structure of a semiconductor device according to a first embodiment of the present invention, in which the semiconductor device does not have a capacitor shown in FIG. 2.

FIG. 4A shows the structure of the semiconductor device according to the first embodiment of the present invention, in which the semiconductor device does not have capacitor 500 shown in FIG. 2.

As shown in FIG. 4A, memory controller 400 and two sockets 600-1 to 600-2 are connected. Memory modules 100-1 to 100-2 are mounted on sockets 600-1 to 600-2, respectively. In addition, memory controller 400 and memory modules 100-1 to 100-2 are connected in Fly-by Topology. FIG. 4A shows only a transmission line that transmits alert signals. The output terminals of the plurality of memory modules 100-1 to 100-2 are connected in a rosary shape through sockets 600-1 to 600-2, respectively. The output terminal of memory module 100-1 connected to one end of the rosary structure is connected to memory controller 400 through socket 600-1 and the transmission line.

Next, the connections of the semiconductor device shown in FIG. 4A will be described.

Figure 4B:
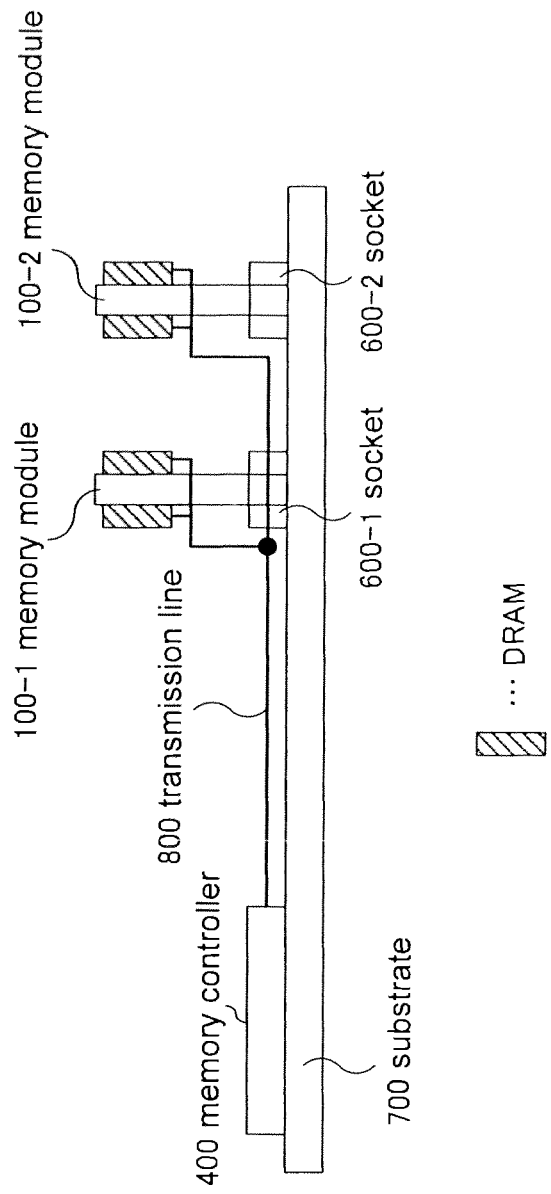
FIG. 4B is a schematic diagram showing connections of the semiconductor device shown in FIG. 4A.

As shown in FIG. 4B, memory controller 400 and sockets 600-1 to 600-2 are mounted on substrate 700. In addition, memory modules 100-1 to 100-2 are mounted on sockets 600-1 to 600-2, respectively. Memory controller 400 and memory modules 100-1 to 100-2 mounted on sockets 600-1 to 600-2 are connected through transmission line 800 having the Fly-by Topology structure. A plurality of DRAMs are mounted on each of memory modules 100-1 to 100-2.

Simulation results for waveforms of alert signals that are output from alert terminal 201-9 of DRAM 200-9 mounted on each of memory modules 100-1 to 100-2 and that are observed by memory controller 400 in the structure shown in FIGS. 4A and 4B are as follows. Simulations are based on Typical at a speed of DDR4-2400. In the transmission line shown in FIG. 4A, the length of a first portion of the transmission line (TLMB1) is 7.6 mm, the length of a second portion of the transmission line (TLMB2) is 50 mm, and the length of a third portion of the transmission line (TLMB3) is 13 mm. In addition, a termination resistor is connected to the end of transmission line 800 through memory controller 400. The resistance in the ON state of the open drain driver of each DRAM is 34 ohms (Typ). The characteristic impedance of the line (transmission line) for alert signals in each DRAM is 50 ohms (hereinafter this impedance is represented by Z0).

Figure 5A:
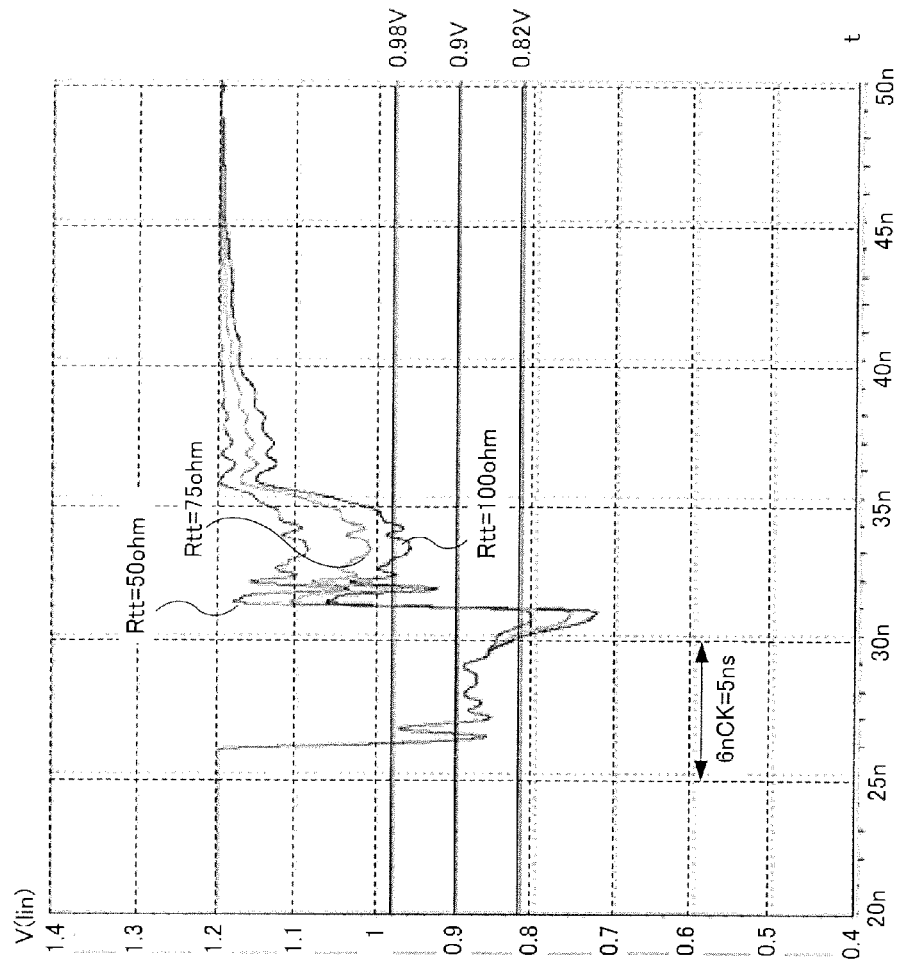
FIG. 5A is a graph showing waveforms of alert signals that are output from an alert terminal of DRAM 200-9 mounted on memory module 100-2 and that are observed by a memory controller in the case in which the resistance of a termination resistor of the memory controller is 50 ohms and the resistance of a termination resistor of the memory module is set to 50, 75, and 100 ohms.

FIG. 5A is a graph that shows waveforms of alert signals that are output from alert terminal 201-9 of DRAM 200-9 mounted on memory module 100-2 and that are observed by memory controller 400 in the case in which the resistance of a termination resistor of memory controller 400 is 50 ohms and the resistance of termination resistor (Rtt) 301 of memory module 100-2 is set to 50, 75, and 100 ohms, respectively indicated by "Rtt=50 ohm". "Rtt=75 ohm", and "Rtt=: 100 ohm". A horizontal axis of the graph represents time indicated by "t", showing a range from 20 ns (nanosecond) to 50 ns (nanosecond) along and having an interval of 5 ns, that is equivalent of 6nCK where nCK represents one clock cycle. A vertical axis of the graph represents V(lin) over a range of 0.4(V) to 1.4(V) for voltages of the alert signals output from alert terminal 201-9 of DRAM 200-9, having an interval of 0.1 V. Reference lines are provided for the voltage 0.82V, 0.9V, and 0.98 V. Please note that graph legends described with reference to FIG. 5A are applicable to FIGS. 5B, 6A, 6B, 7A, 7B, 8A, 8B, 10A, 10B, 11A, 11B, 13, 14, 17A, 17B, 17C, 18A, 181, 18C, 19A, 19B and 19C.

Figure 5B:
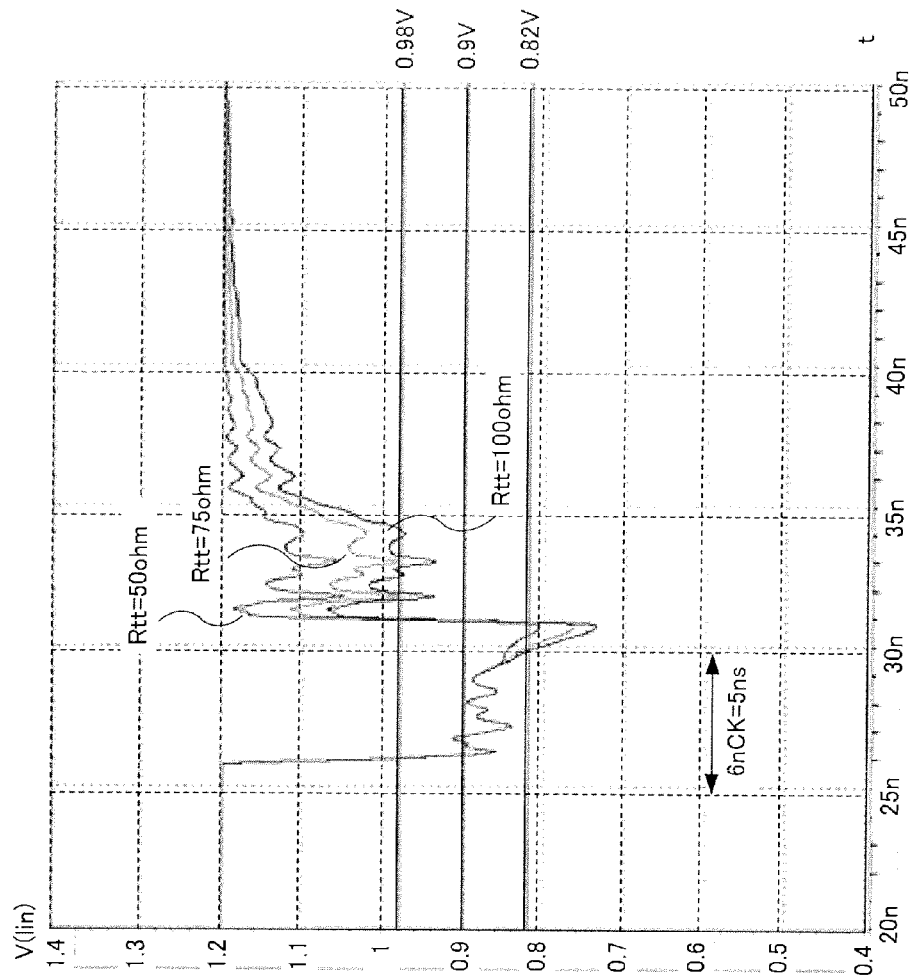
FIG. 5B is a graph showing waveforms of alert signals that are output from the alert terminal of DRAM 200-9 mounted on memory module 100-1 and that are observed by the memory controller in the case in which the resistance of the termination resistor of the memory controller is 50 ohms and the resistance of the termination resistor of the memory module is set to 50, 75, and 100 ohms.

FIG. 5B shows waveforms of alert signals that are output from alert terminal 201-9 of DRAM 200-9 mounted on memory module 100-1 and that are observed by memory controller 400 in the case in which the resistance of the termination resistor of memory controller 400 is 50 ohms and the resistance of termination resistor 301 of memory module 100-1 is set to 50, 75, and 100 ohms.

Figure 6A:
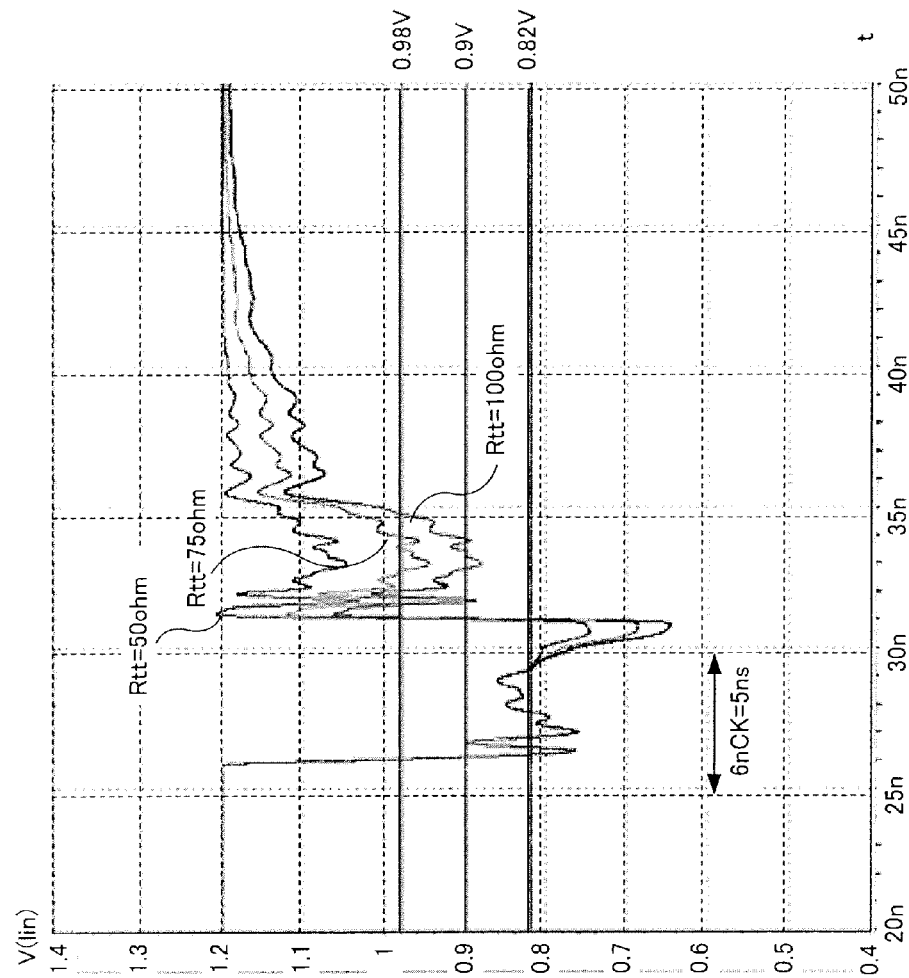
FIG. 6A is a graph showing waveforms of alert signals that are output from the alert terminal of DRAM 200-9 mounted on memory module 100-2 and that are observed by the memory controller in the case in which the resistance of the termination resistor of the memory controller is 100 ohms and the resistance of the termination resistor of the memory module is set to 50, 75, and 100 ohms.

FIG. 6A shows waveforms of alert signals that are output from alert terminal 201-9 of DRAM 200-9 mounted on memory module 100-2 and that are observed by memory controller 400 in the case in which the resistance of the termination resistor of memory controller 400 is 100 ohms and the resistance of termination resistor 301 of memory module 100-2 is set to 50, 75, and 100 ohms.

Figure 6B:
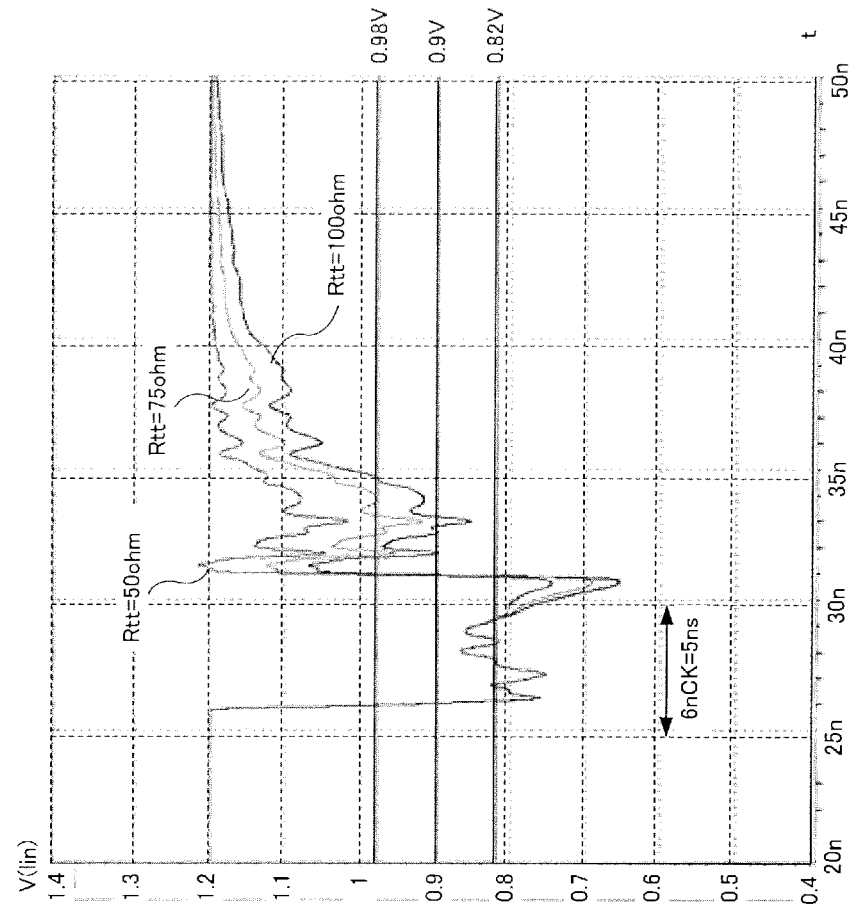
FIG. 6B is a graph showing waveforms of alert signals that are output from the alert terminal of DRAM 200-9 mounted on memory module 100-1 and that are observed by the memory controller in the case in which the resistance of the termination resistor of the memory controller is 100 ohms and the resistance of the termination resistor of the memory module is set to 50, 75, and 100 ohms.

FIG. 6B shows waveforms of alert signals that are output from alert terminal 201-9 of DRAM 200-9 mounted on memory module 100-1 and that are observed by memory controller 400 in the case in which the resistance of the termination resistor of memory controller 400 is 100 ohms and the resistance of termination resistor 301 of memory module 100-1 is set to 50, 75, and 100 ohms.

Figure 7A:
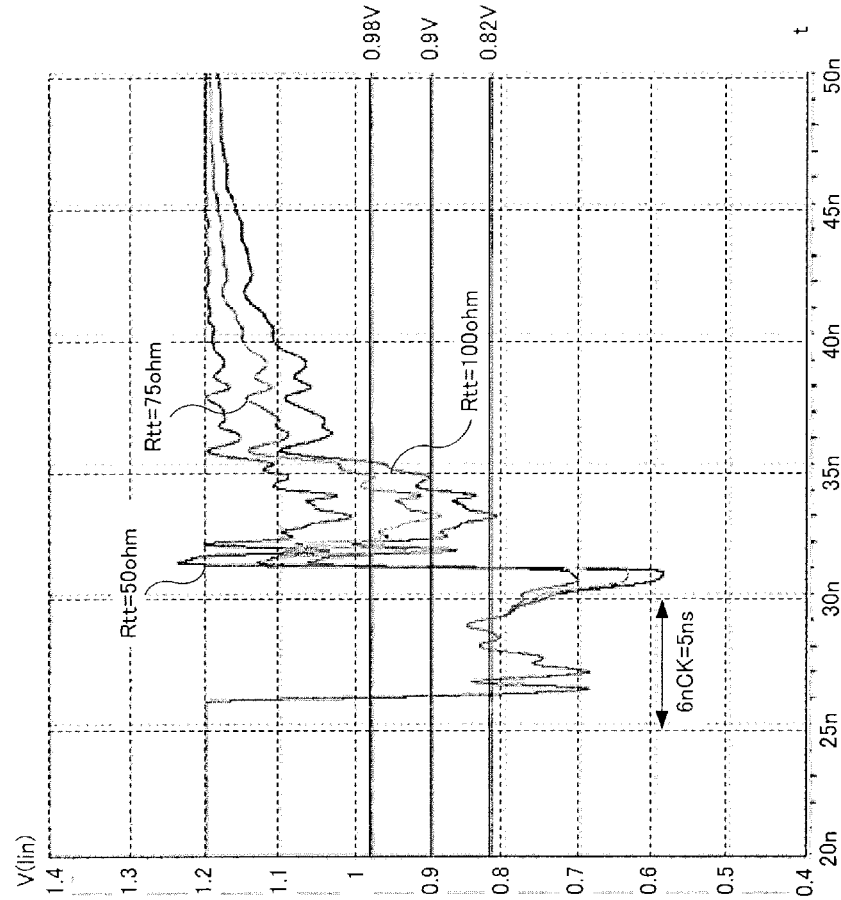
FIG. 7A is a graph showing waveforms of alert signals that are output from the alert terminal of DRAM 200-9 mounted on memory module 100-2 and that are observed by the memory controller in the case in which the resistance of the termination resistor of the memory controller is 200 ohms and the resistance of the termination resistor of the memory module is set to 50, 75, and 100 ohms.

FIG. 7A shows waveforms of alert signals that are output from alert terminal 201-9 of DRAM 200-9 mounted on memory module 100-2 and that are observed by memory controller 400 in the case in which the resistance of the termination resistor of memory controller 400 is 200 ohms and the resistance of termination resistor 301 of memory module 100-2 is set to 50, 75, and 100 ohms.

Figure 7B:
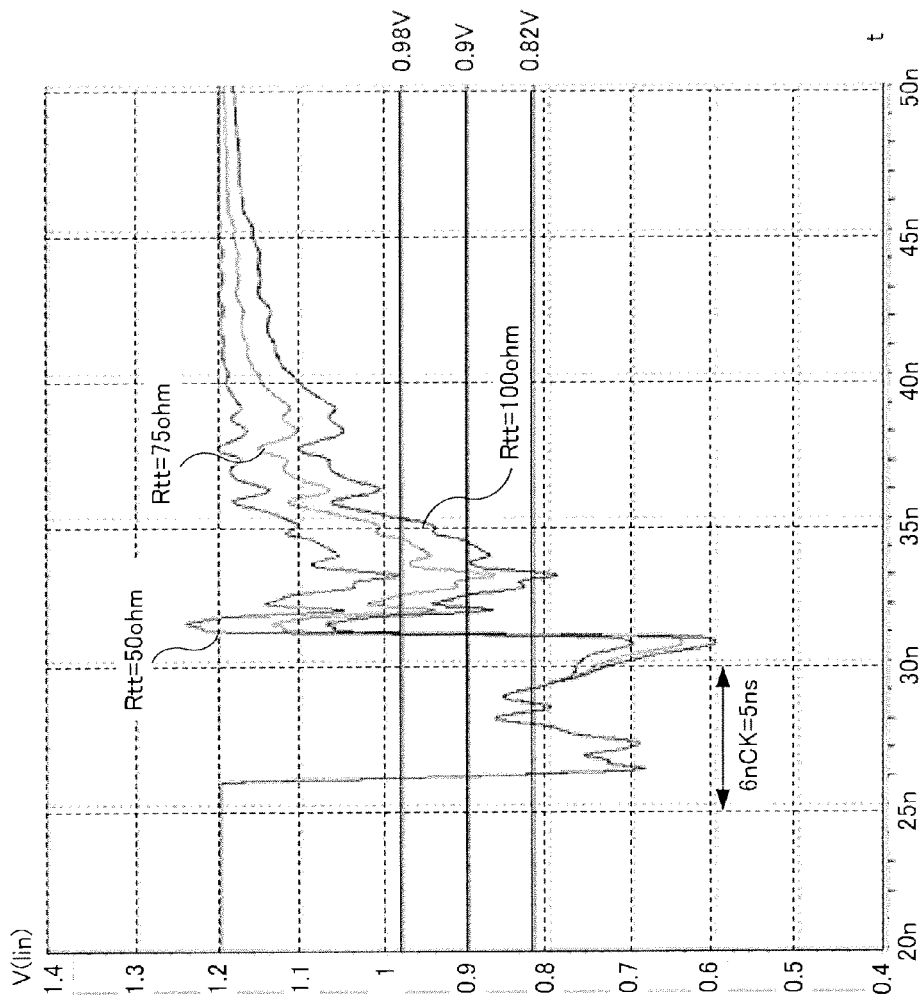
FIG. 7B is a graph showing waveforms of alert signals that are output from the alert terminal of DRAM 200-9 mounted on memory module 100-1 and that are observed by the memory controller in the case in which the resistance of the termination resistor of the memory controller is 200 ohms and the resistance of the termination resistor of the memory module is set to 50, 75, and 100 ohms.

FIG. 7B shows waveforms of alert signals that are output from alert terminal 201-9 of DRAM 200-9 mounted on memory module 100-1 and that are observed by memory controller 400 in the case in which the resistance of the termination resistor of memory controller 400 is 200 ohms and the resistance of termination resistor 301 of memory module 100-1 is set to 50, 75, and 100 ohms.

Figure 8A:
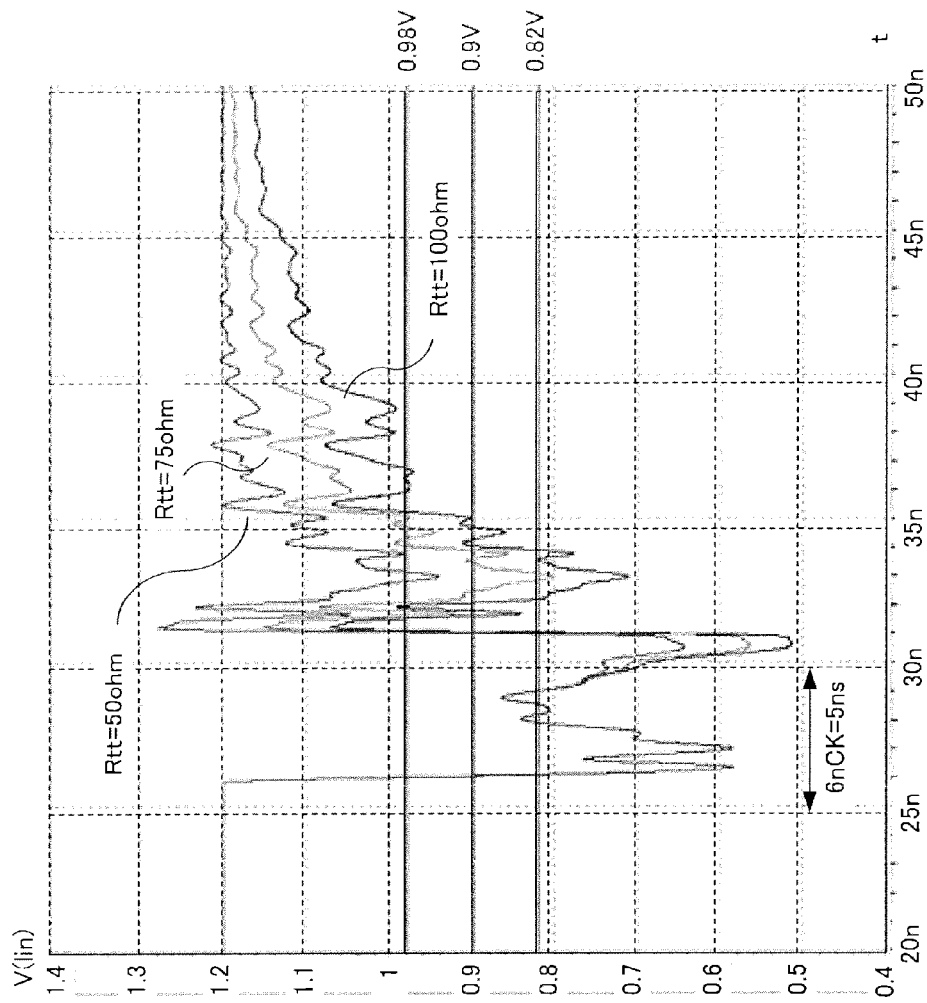
FIG. 8A is a graph showing waveforms of alert signals that are output from the alert terminal of DRAM 200-9 mounted on memory module 100-2 and that are observed by the memory controller in the case in which the termination resistor of the memory controller is not connected and the resistance of the termination resistor of the memory module is set to 50, 75, and 100 ohms.

FIG. 8A shows waveforms of alert signals that are output from alert terminal 201-9 of DRAM 200-9 mounted on memory module 100-2 and that are observed by memory controller 400 in the case in which the termination resistor of memory controller 400 is not connected and the resistance of termination resistor 301 of memory module 100-2 is set to 50, 75, and 100 ohms.

Figure 8B:
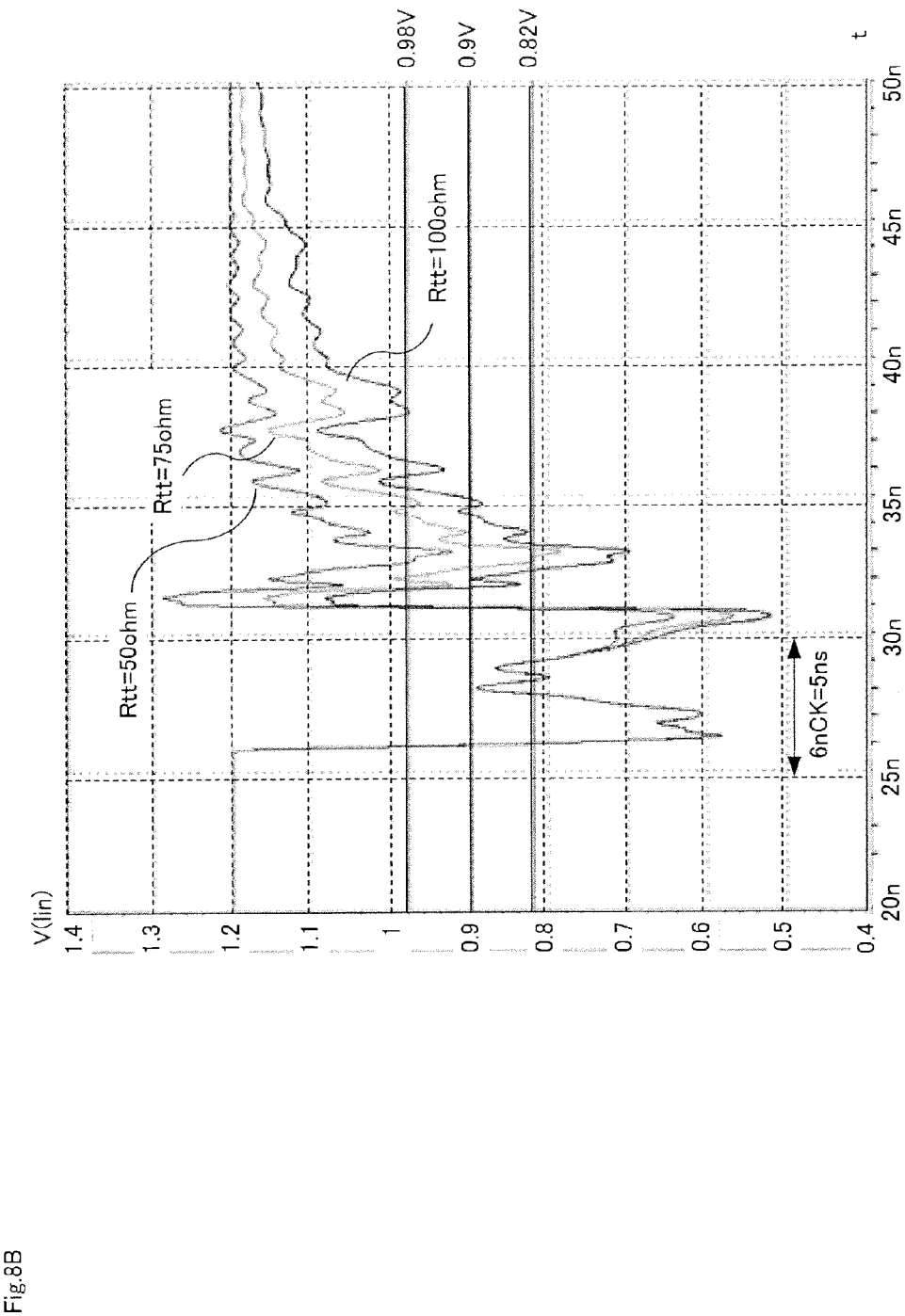
FIG. 8B is a graph showing waveforms of alert signals that are output from the alert terminal of DRAM 200-9 mounted on memory module 100-1 and that are observed by the memory controller in the case in which the termination resistor of the memory controller is not connected and the resistance of the termination resistor of the memory module is set to 50, 75, and 100 ohms.

FIG. 8B shows waveforms of alert signals that are output from alert terminal 201-9 of DRAM 200-9 mounted on memory module 100-1 and that are observed by memory controller 400 in the case in which the termination resistor of memory controller 400 is not connected and the resistance of termination resistor 301 of memory module 100-1 is set to 50, 75, and 100 ohms.

The results shown in FIGS. 5A to 5B, 6A to 6B, 7A to 7B, and 8A to 8B reveal that when the resistance of termination resistor 301 is 50 ohms, reflections of signals can be reduced most effectively and that when the resistance of the termination resistor of memory controller 400 is 200 ohms or the termination resistor is not connected, alert signals can be kept at low levels. However, since distortions of the waveforms become large and since it is assumed that candidate signal levels of received signals of memory controller 400 are VIHmin=0.75×VDD+80 mV and VILmax=0.75×VDD−80 mV, other countermeasures would be required.

Figure 9:
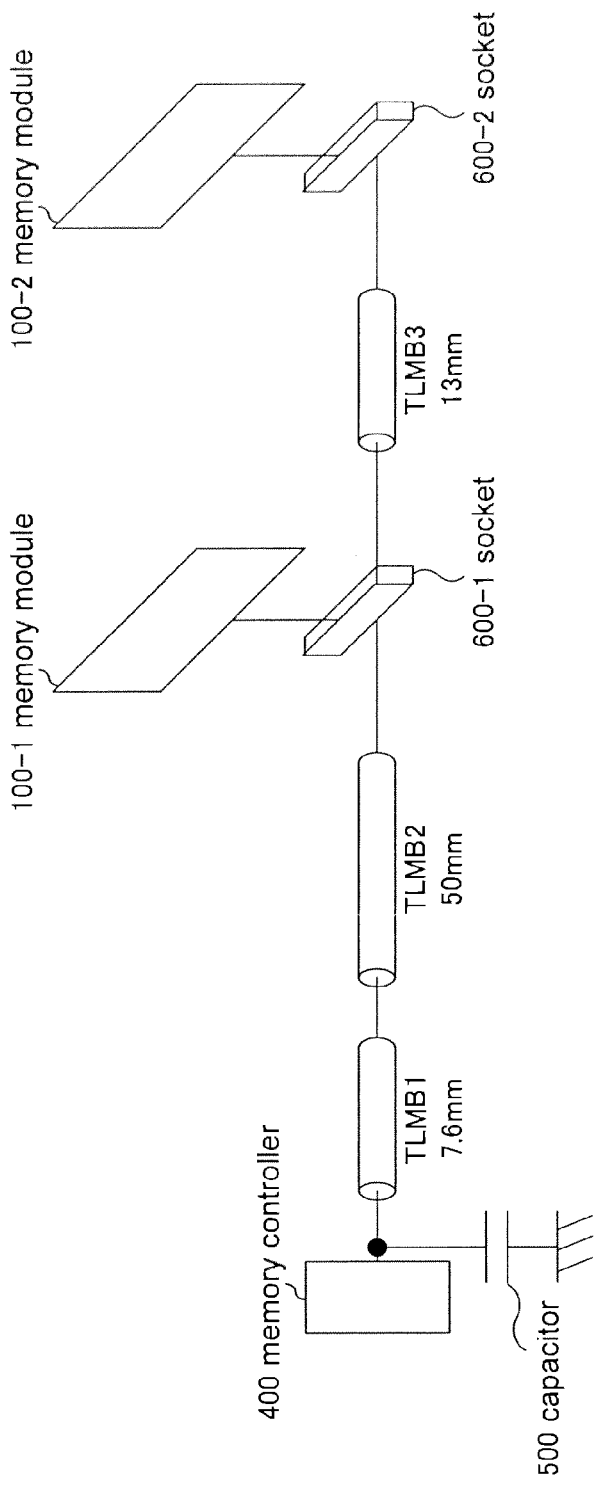
FIG. 9 is a schematic diagram showing an example of the structure of the semiconductor device according to the first embodiment of the present invention.

FIG. 9 shows an example of the structure of the semiconductor device according to the first embodiment of the present invention. With reference to FIG. 9, memory controller 400 and two sockets 600-1 to 600-2 are connected. Memory modules 100-1 to 100-2 are mounted on sockets 600-1 to 600-2, respectively. In addition, memory controller 400 and memory modules 100-1 to 100-2 are connected in Fly-by Topology. In addition, the connection line (transmission line) is grounded through capacitor 500 in the vicinity of memory controller 400. The capacitance of capacitor 500 is 30 pF. FIG. 9 shows only a transmission line that transmits alert signals.

Simulation results for waveforms of alert signals that are output from alert terminal 201-9 of DRAM 200-9 mounted on each of memory modules 100-1 to 100-2 and that are observed by memory controller 400 in the structure shown in FIG. 9 are as follows. In the transmission line shown in FIG. 4A, the length of TLMB1 is 7.6 mm, the length of TLMB2 is 50 mm, and the length of TLMB3 is 13 mm. A termination resistor is connected to the end of the transmission line in memory controller 400. The resistance in the ON state of the open drain driver of each DRAM is 34 ohms (Typ). Z0 is 50 ohms. The resistance of termination resistor 301 is 50 ohms. The simulation condition is the Typical.

Figure 10A:
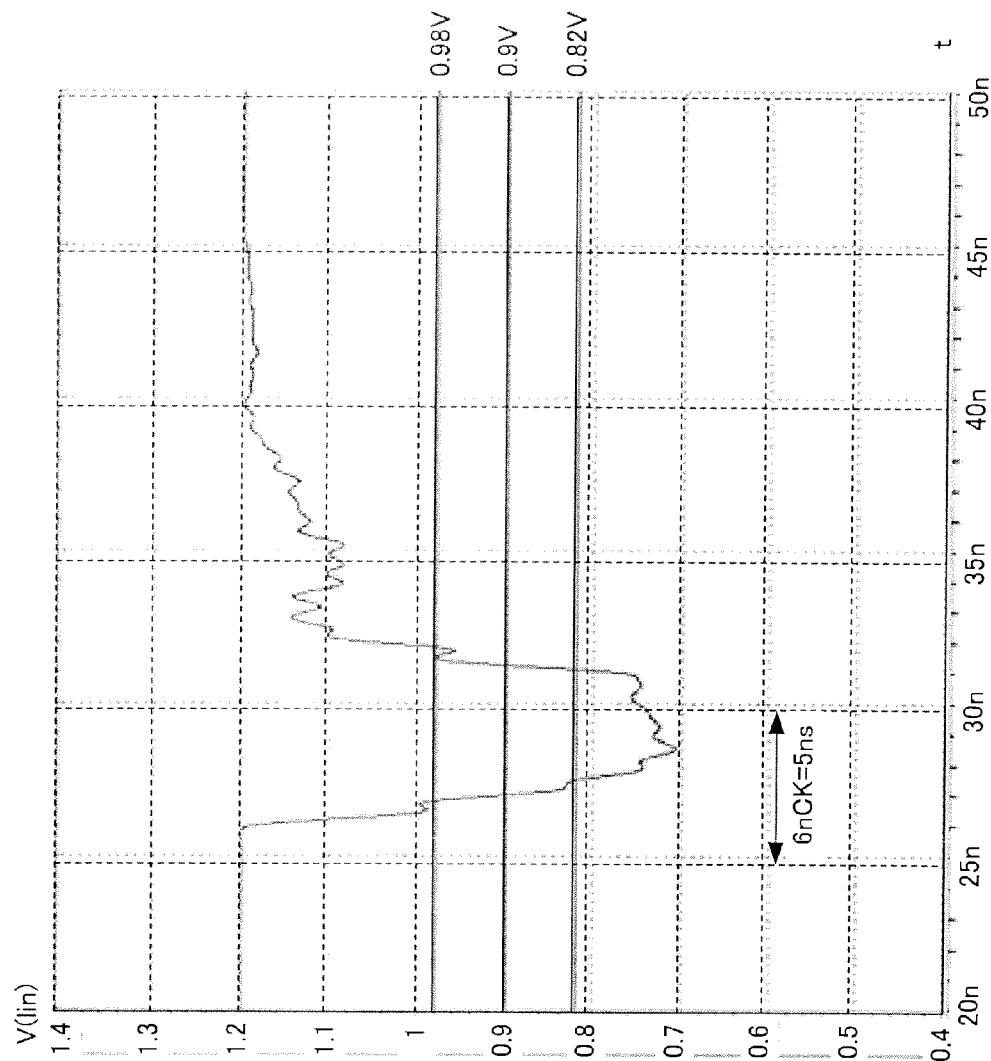
FIG. 10A is a graph showing a waveform of an alert signal that is output from the alert terminal of DRAM 200-9 mounted on memory module 100-2 and that is observed by a memory controller in the structure shown in FIG. 9 and in the case in which the resistance of a termination resistor of the memory controller is 200 ohms.

FIG. 10A shows a waveform of an alert signal that is output from alert terminal 201-9 of DRAM 200-9 mounted on memory module 100-2 and that is observed by memory controller 400 in the case in which the resistance of the termination resistor of memory controller 400 is 200 ohms.

Figure 10B:
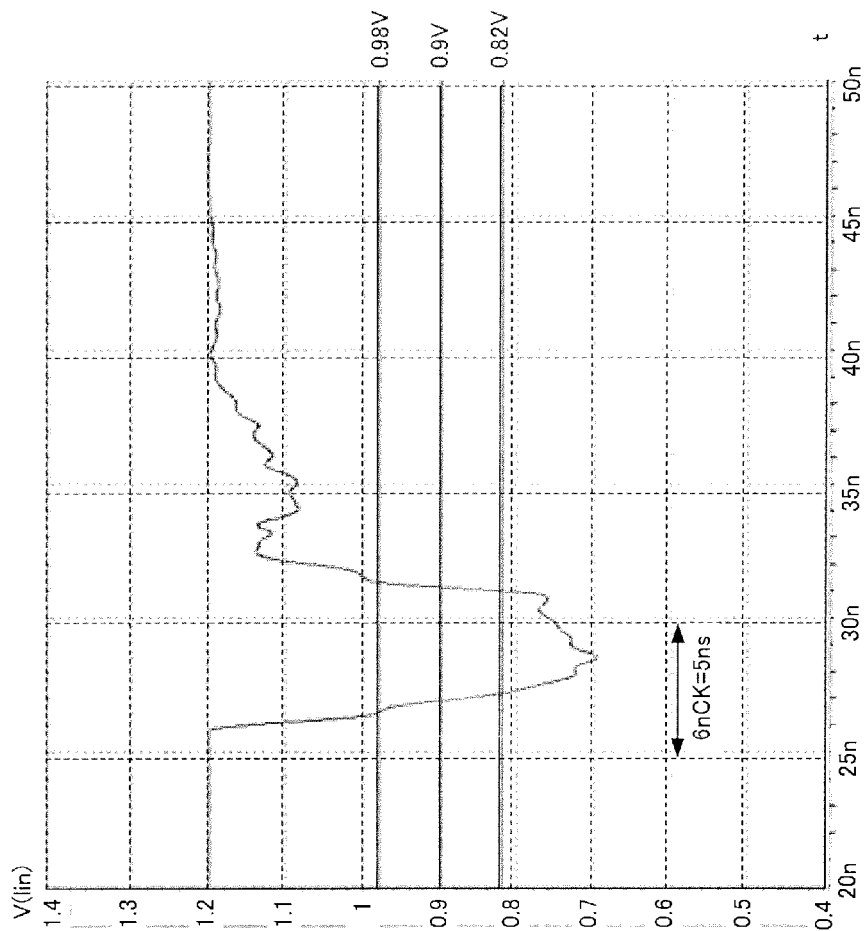
FIG. 10B is a graph showing a waveform of an alert signal that is output from the alert terminal of DRAM 200-9 mounted on memory module 100-1 and that is observed by the memory controller in the structure shown in FIG. 9 and in the case in which the resistance of the termination resistor of the memory controller is 200 ohms.

FIG. 10B shows a waveform of an alert signal that is output from alert terminal 201-9 of DRAM 200-9 mounted on memory module 100-1 and that is observed by memory controller 400 in the case in which the resistance of the termination resistor of memory controller 400 is 200 ohms.

Figure 11A:
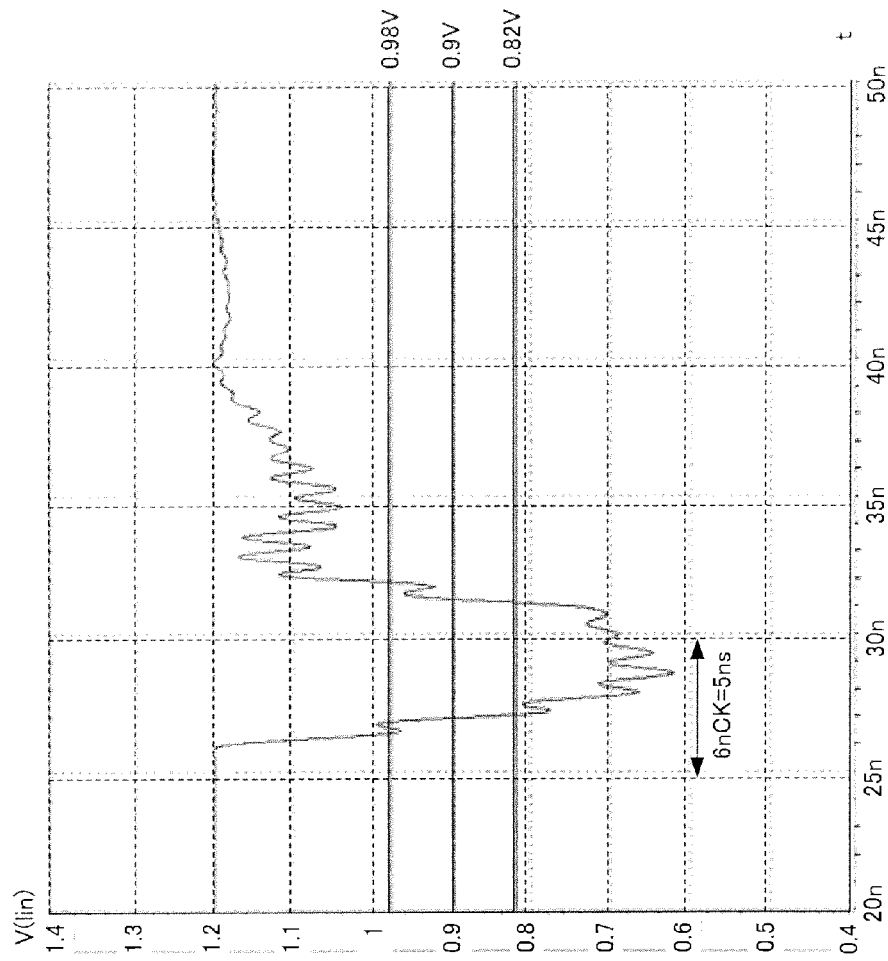
FIG. 11A is a graph showing a waveform of an alert signal that is output from the alert terminal of DRAM 200-9 mounted on memory module 100-2 and that is observed by the memory controller in the structure shown in FIG. 9 and in the case in which the termination resistor of the memory controller is not connected.

FIG. 11A shows a waveform of an alert signal that is output from alert terminal 201-9 of DRAM 200-9 mounted on memory module 100-2 and that is observed by memory controller 400 in the case in which the termination resistor of memory controller 400 is not connected.

Figure 11B:
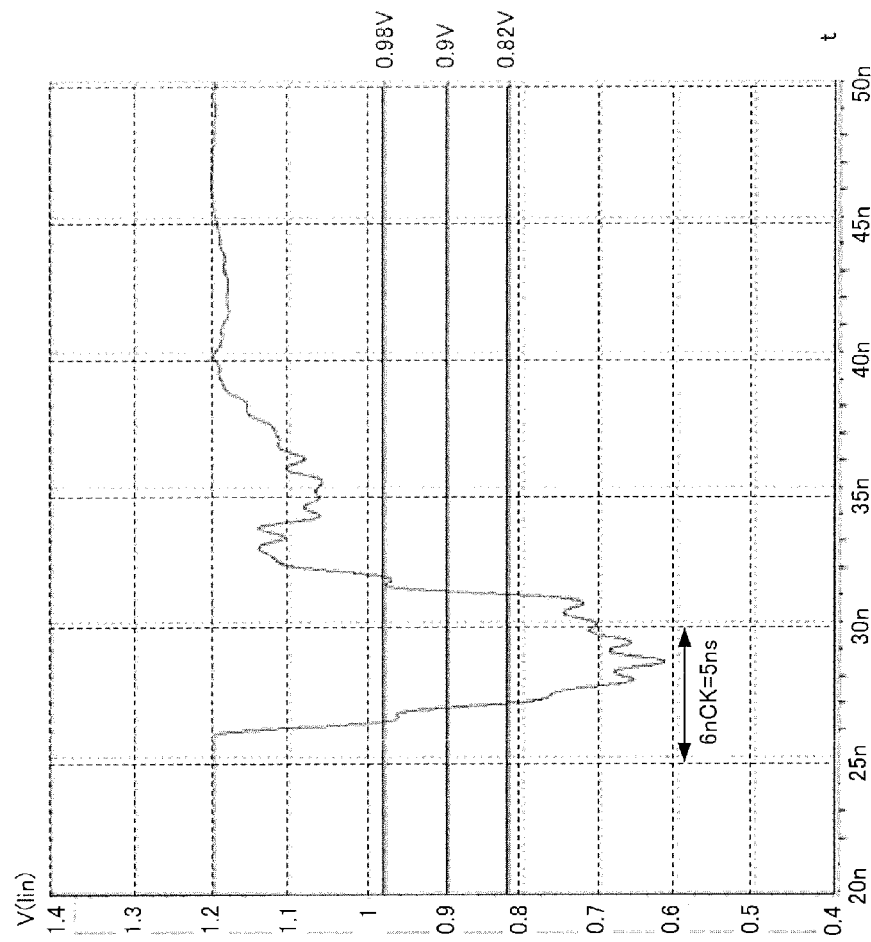
FIG. 11B is a graph showing a waveform of an alert signal that is output from the alert terminal of DRAM 200-9 mounted on memory module 100-1 and that is observed by the memory controller in the structure shown in FIG. 9 and in the case in which the termination resistor of the memory controller is not connected.

FIG. 11B shows a waveform of an alert signal that is output from alert terminal 201-9 of DRAM 200-9 mounted on memory module 100-1 and that is observed by memory controller 400 in the case in which the termination resistor of memory controller 400 is not connected.

The results shown in FIGS. 10A to 10B and 11A to 11B reveal that when capacitor 500 is connected to memory controller 400, distortions of waveforms become small compared with the measured results in the structure shown in FIG. 4A and that the signal levels of the received signals of memory controller 400 (VIHmin=0.75×VDD+80 mV and VILmax=0.75×VDD−80 mV) are appropriate.

Figure 12A:
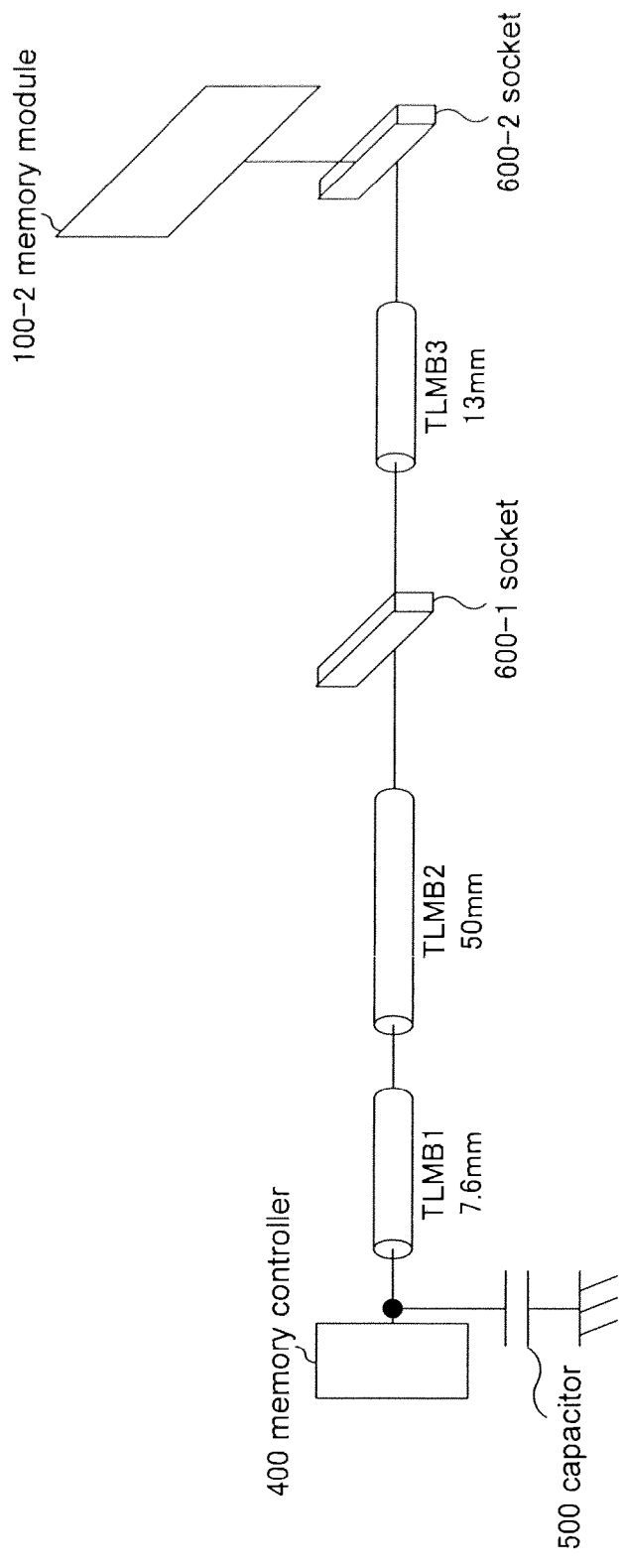
FIG. 12A is a schematic diagram showing another example of the structure of the semiconductor device according to the first embodiment of the present invention.

FIG. 12A shows another example of the structure of the semiconductor device according to the first embodiment of the present invention. With reference FIG. 12A, memory module 100-1 is not mounted on socket 600-1 shown in FIG. 9 and only one memory module is connected to memory controller 400. The capacitance of capacitor 500 is 30 pF.

Next, the connections of the semiconductor device shown in FIG. 12A will be described.

Figure 12B:
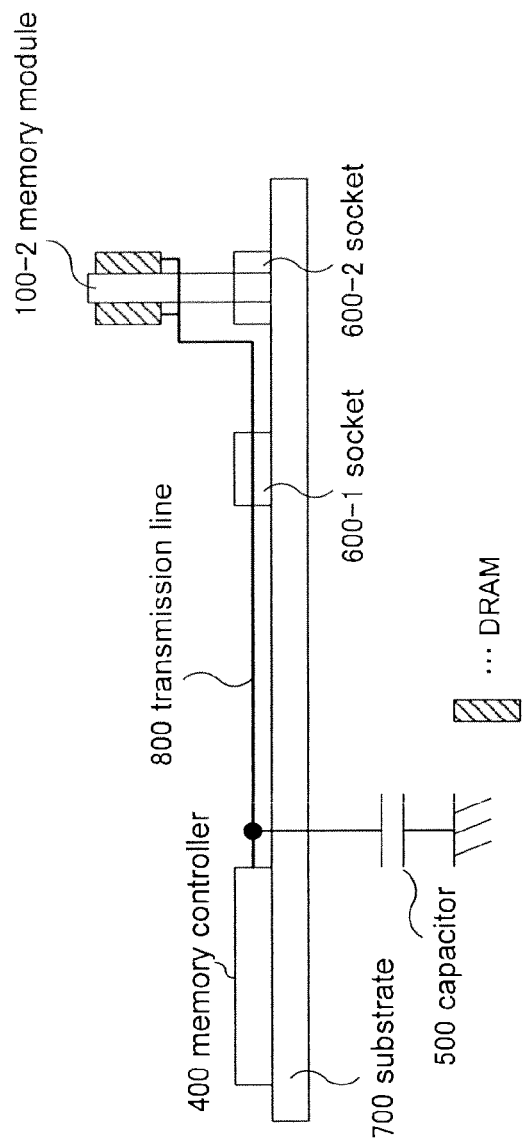
FIG. 12B is a schematic diagram showing connections of the semiconductor device shown in FIG. 12A.

As shown in FIG. 12B, memory controller 400 and socket 600-2 are mounted on substrate 700. In addition, memory module 100-2 is mounted on socket 600-2. Memory controller 400 and memory module 100-2, which is mounted on socket 600-2, are connected through transmission line 800 having the Fly-by Topology structure. In addition, memory controller 400 and memory module 100-2 are connected in the point-to-point structure. A plurality of DRAMs are mounted on memory module 100-2. In contrast, memory module 100-1 is not mounted on socket 600-1.

Simulation results for waveforms of alert signals that are output from alert terminal 201-9 of DRAM 200-9 mounted on memory module 100-2 and that are observed by memory controller 400 in the structure shown in FIGS. 12A and 12B are as follows. In the transmission line shown in FIG. 12A, the length of TLMB1 is 7.6 mm, the length of TLMB2 is 50 mm, and the length of TLMB3 is 13 mm. A termination resistor is connected to the end of the transmission line through memory controller 400. The resistance in the ON state of the open drain driver of each DRAM is 34 ohms (Typ). Z0 is 50 ohms. The resistance of termination resistor 301 is 50 ohms. The simulation condition is Typical.

Figure 13:
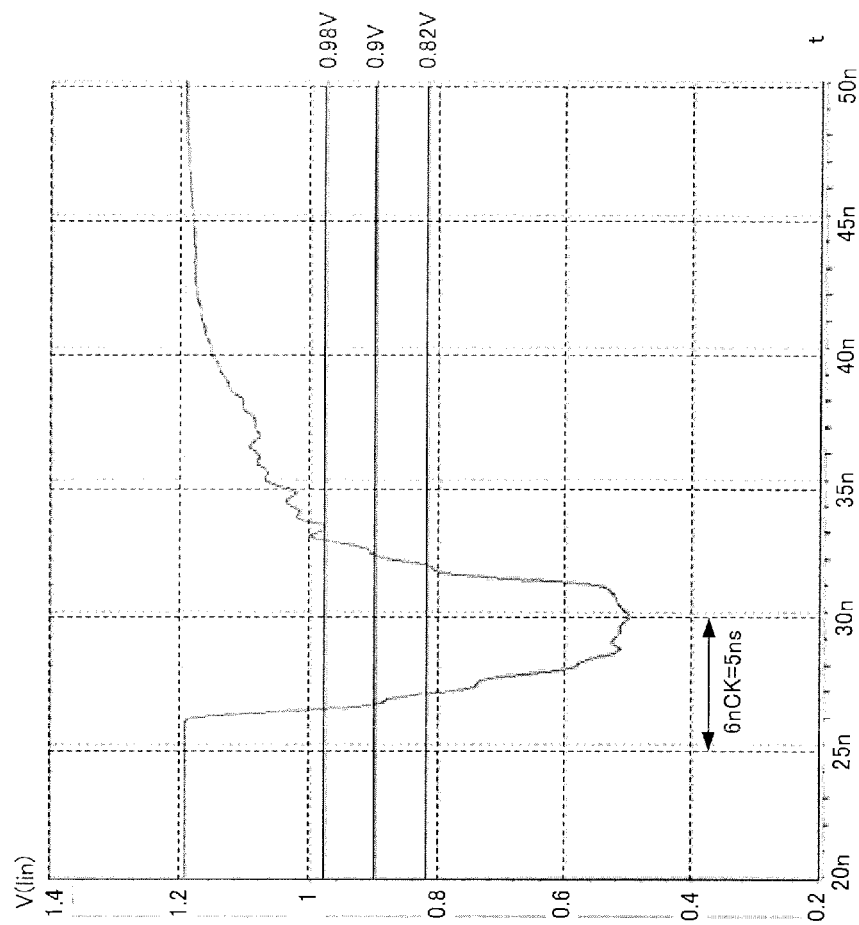
FIG. 13 is a graph showing a waveform of an alert signal that is output from the alert terminal of DRAM 200-9 mounted on memory module 100-2 and that is observed by a memory controller in the structure shown in FIG. 12A and in the case in which the resistance of a termination resistor of the memory controller is 200 ohms.

FIG. 13 shows a waveform of an alert signal that is output from alert terminal 201-9 of DRAM 200-9 mounted on memory module 100-2 and that is observed by memory controller 400 in the case in which the resistance of the termination resistor of memory controller 400 is 200 ohms.

Figure 14:
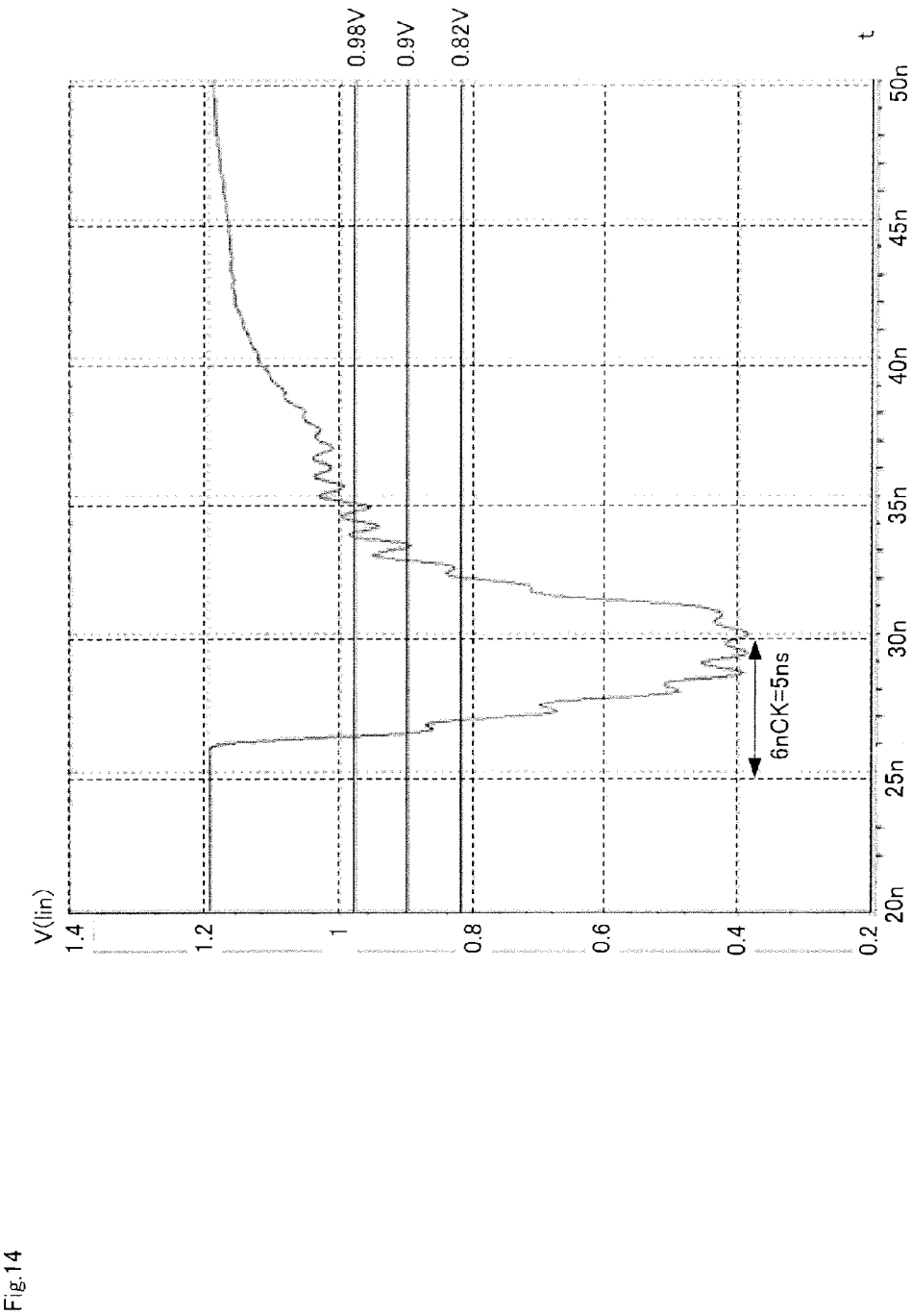
FIG. 14 is a graph showing a waveform of an alert signal that is output from the alert terminal of DRAM 200-9 mounted on memory module 100-2 and that is observed by the memory controller in the structure shown in FIG. 12A and in the case in which the termination resistor of the memory controller is not connected.

FIG. 14 shows a waveform of an alert signal that is output from alert terminal 201-9 of DRAM 200-9 mounted on memory module 100-2 and that is observed by memory controller 400 in the case in which the termination resistor of memory controller 400 is not connected.

The results shown in FIGS. 13 and 14 reveal that the 1DPC (DIMM Per Channel) structure does not adversely distort waveforms of alert signals as in the 2DPC structure shown in FIG. 9. In addition, the 2DPC structure does not adversely affect the signal levels of the received signals of memory controller 400 (VIHmin=0.75×VDD+80 mV and VILmax=0.75×VDD−80 mV).

Waveforms of alert signals are measured in the Typical condition where the resistance in the ON state of the open drain driver of each DRAM is 34 ohms. However, the resistance of the resistor (Ron) fluctuates such that the minimum resistance of this resistor is 27.2 ohms (Fast condition) and the maximum resistance of the resistor is 40.8 ohms (Slow condition). Thus it is necessary to consider conditions that have to be applied and that depend on specific cases such as power supply voltage.

FIG. 15 shows the relationship between voltages and conditions where VDDQ (pull-up voltage of termination resistor 301) in the Fast condition is 1.26 V and VIHmin (minimum value where voltage is recognized to be High level) in the Fast condition is 1.025 V. Vref (reference voltage) in the Fast condition is 0.945 V. VILmax (maximum value where voltage is recognized to be Low level in the Fast condition) is 0.865 V. VDDQ in the Slow condition is 1.14 V. VIHmin in the Slow condition is 0.935 V. Vref in the Slow condition is 0.855 V. VILmax in the Slow condition is 0.775 V.

VA1 is calculated using these values, Z0, Ron, and Formula (1). VA1 is the voltage at the end on the drain side of the transmission line for alert signals of each DRAM when Open Drain of the alert signal output of the DRAM is ON. In this case, Z0 is 50 ohms.

$$VA1 = Vinitial \times Ron/(Ron+Z0) \quad \text{(Formula 1)}$$

Since Vinitial is equivalent to the input voltage, Vinitial is equal to VDDQ. The DC Low level margin value is calculated from the calculated VA1.

As shown in FIG. 16, if VDDQ is 1.26 V and Ron is 40.8 ohms, VA1 and DC Low level margin value that is calculated for each condition become 0.566 V and 0.299 V, respectively. This state is referred to as Case 1. If VDDQ is 1.26 V and Ron is 27.2 ohms, VA1 becomes 0.444 V and DC Low level margin value becomes 0.421 V. This state is referred to as Case 2. If VDDQ is 1.14 V and Ron is 40.8 ohms, VA1 becomes 0.512 V and DC Low level margin value becomes 0.263 V. This state is referred to as Case 3. If VDDQ is 1.14 V and Ron is 27.2 ohms, VA1 becomes 0.402 V and DC Low level margin value becomes 0.373 V. This state is referred to as Case 4.

The calculated results shown in FIG. 16 reveals that Case 3 becomes the strictest condition for the DC Low level margin value (Slow condition). When deviations are reduced, Case 2 becomes the strictest condition on ringing point of view (Fast Condition). Observed results of waveforms in these conditions are as follows. The structure the observes these waveforms is the same as that shown in FIG. 9. In this case, the resistance of termination resistor 301 is 50 ohms.

Figure 17A:
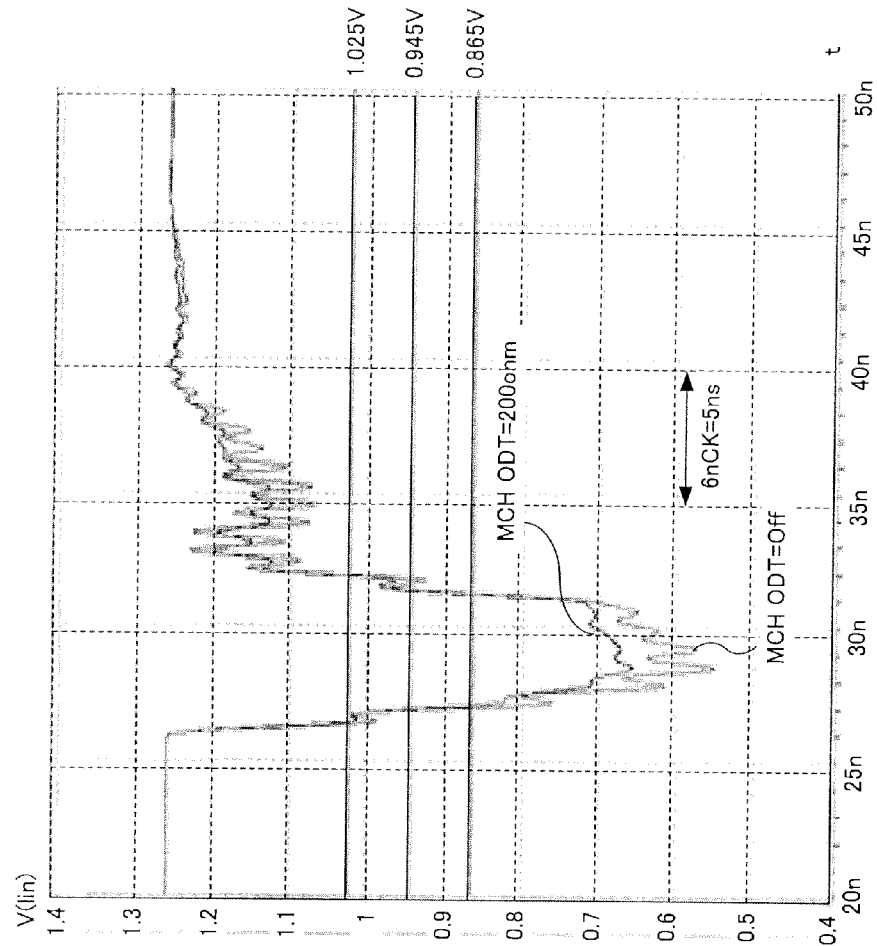
FIG. 17A is a graph showing waveforms of alert signals that are output from the alert terminal of DRAM 200-9 mounted on memory module 100-2 and that are observed by the memory controller in the structure shown in FIG. 9, in the Fast condition, and in the case in which the resistance of the termination resistor of the memory controller is 200 ohms or the termination resistor is not connected to the memory controller.

FIG. 17A is a graph that shows waveforms of alert signals that are output from alert terminal 201-9 of DRAM 200-9 mounted on memory module 100-2 and that are observed by memory controller 400 in the structure shown in FIG. 9, in the Fast condition, and in the case in which the resistance of the termination resistor for on-die termination (ODT) of memory controller (MCH) 400 is 200 ohms ("MCH ODT=200 ohm") or the termination resistor is not connected to memory controller 400 ("MCH ODT=:off"). Please note that references to "MCH_ODT", "MCH_ODT=200 ohm" and "MCH_ODT-off" provided for FIG. 17A are also applicable to FIGS. 17B, 18A. 18B. ISC, 19A. 19B and 19C.

Figure 17B:
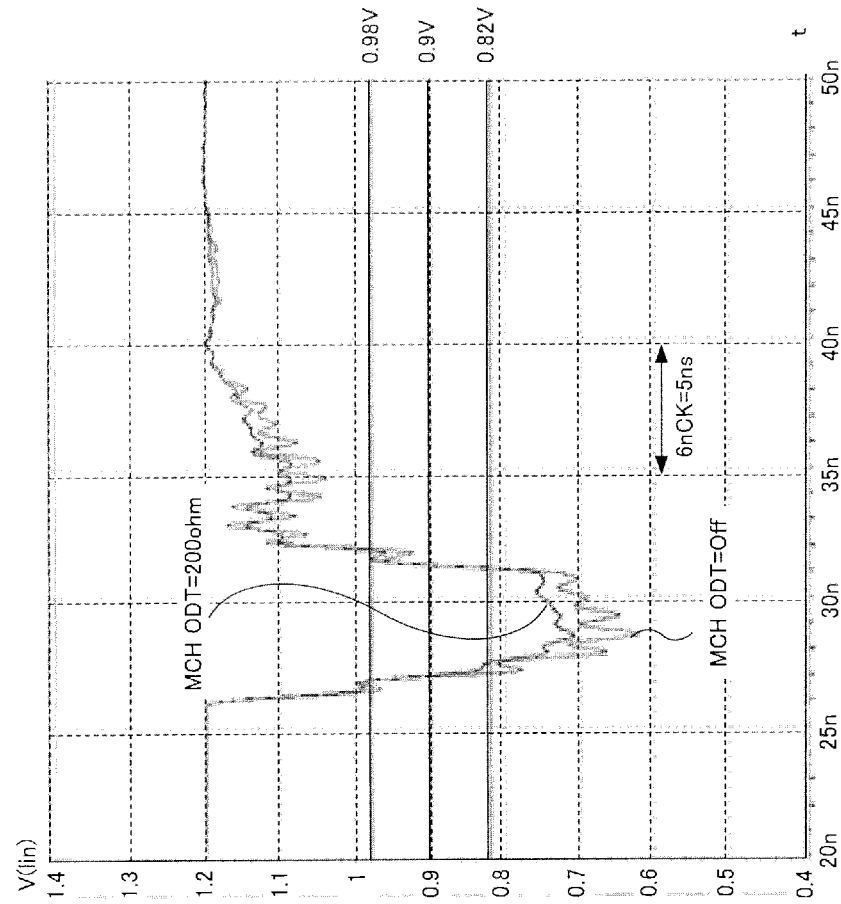
FIG. 17B is a graph showing waveforms of alert signals that are output from the alert terminal of DRAM 200-9 mounted on memory module 100-2 and that are observed by the memory controller in the structure shown in FIG. 9, in the Typical condition, and in the case in which the resistance of the termination resistor of the memory controller is 200 ohms or the termination resistor is not connected to the memory controller.

FIG. 17B shows waveforms of alert signals that are output from alert terminal 201-9 of DRAM 200-9 mounted on memory module 100-2 and that are observed by memory controller 400 in the structure shown in FIG. 9, in the Typical condition, and in the case in which the resistance of the termination resistor of memory controller 400 is 200 ohms or the termination resistor is not connected to memory controller 400.

Figure 17C:
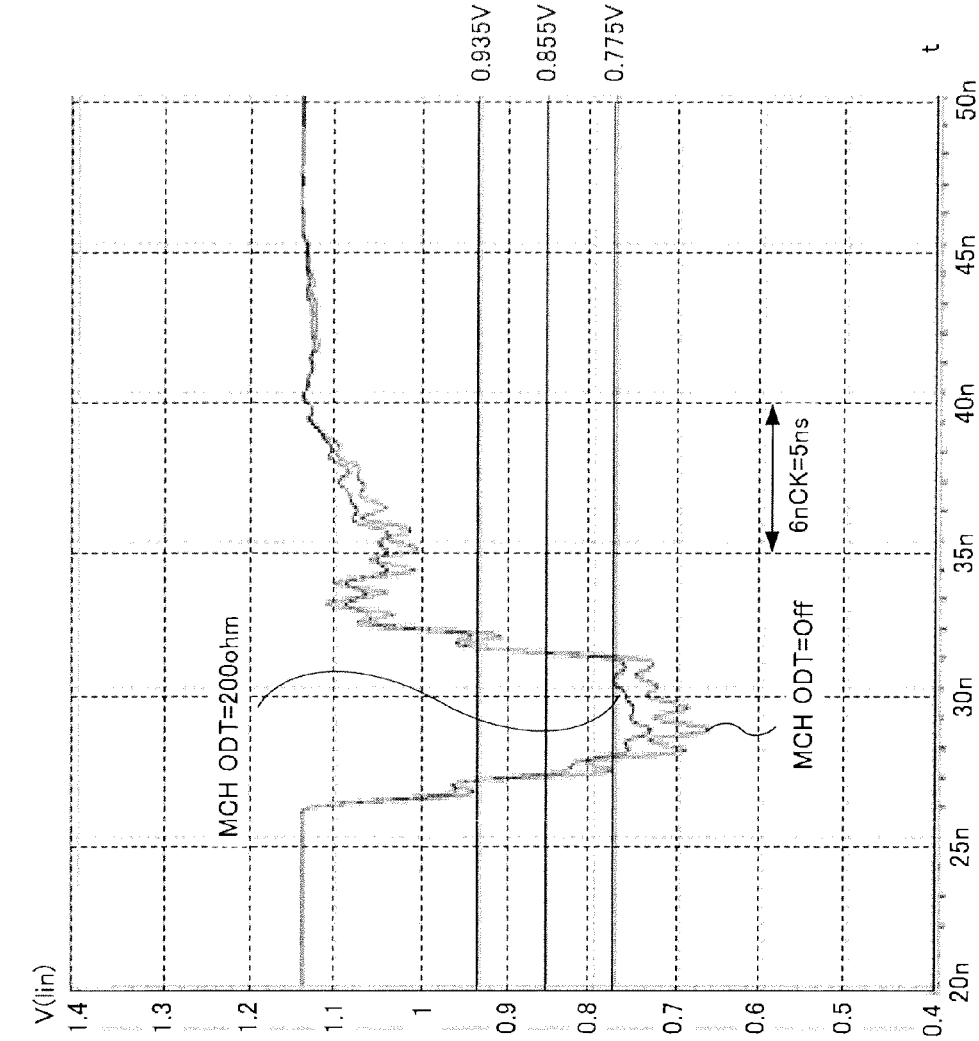
FIG. 17C is a graph showing waveforms of alert signals that are output from the alert terminal of DRAM 200-9 mounted on memory module 100-2 and that are observed by the memory controller in the structure shown in FIG. 9, in the Slow condition, and in the case in which the resistance of the termination resistor of the memory controller is 200 ohms or the termination resistor is not connected to the memory controller.

FIG. 17C shows waveforms of alert signals that are output from alert terminal 201-9 of DRAM 200-9 mounted on memory module 100-2 and that are observed by memory controller 400 in the structure shown in FIG. 9, in the Slow condition, and in the case in which the resistance of the termination resistor of memory controller 400 is 200 ohms or the termination resistor is not connected to memory controller 400.

Figure 18A:
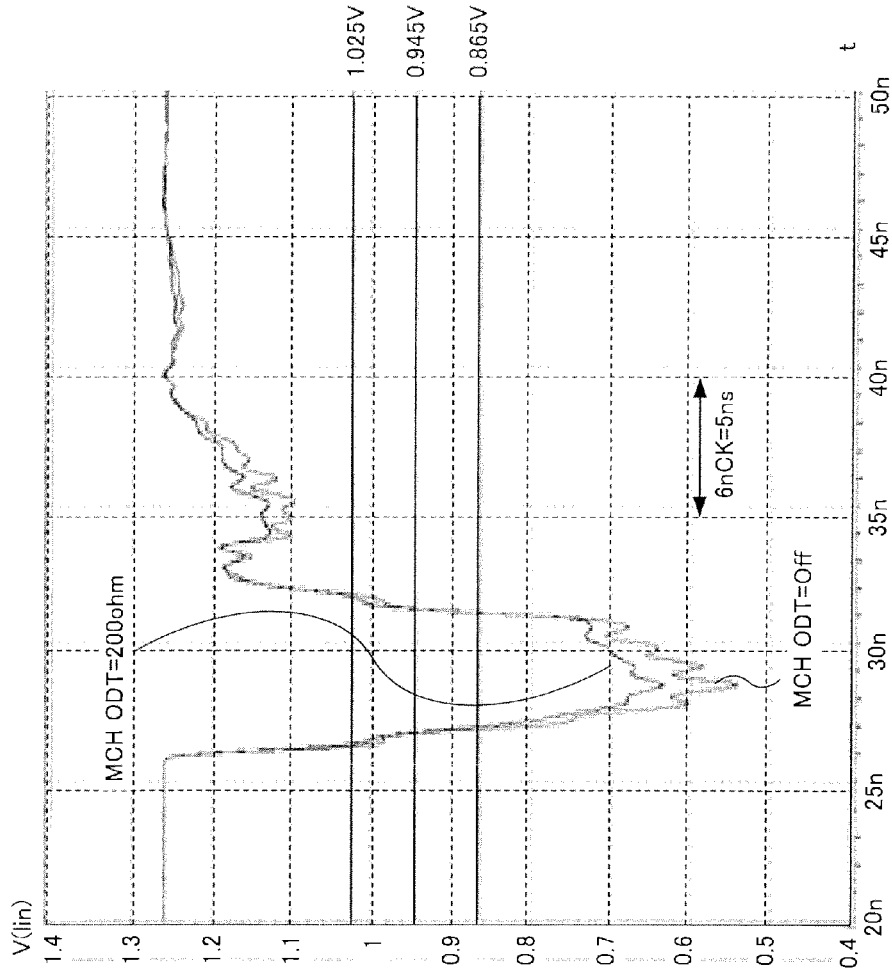
FIG. 18A is a graph showing waveforms of alert signals that are output from the alert terminal of DRAM 200-9 mounted on memory module 100-1 and that are observed by the memory controller in the structure shown in FIG. 9, in the Fast condition, and in the case in which the resistance of the termination resistor of the memory controller is 200 ohms or the termination resistor is not connected to the memory controller.

FIG. 18A shows waveforms of alert signals that are output from alert terminal 201-9 of DRAM 200-9 mounted on memory module 100-1 and that are observed by memory controller 400 in the structure shown in FIG. 9, in the Fast condition, and in the case in which the resistance of the termination resistor of memory controller 400 is 200 ohms or the termination resistor is not connected to memory controller 400.

Figure 18B:
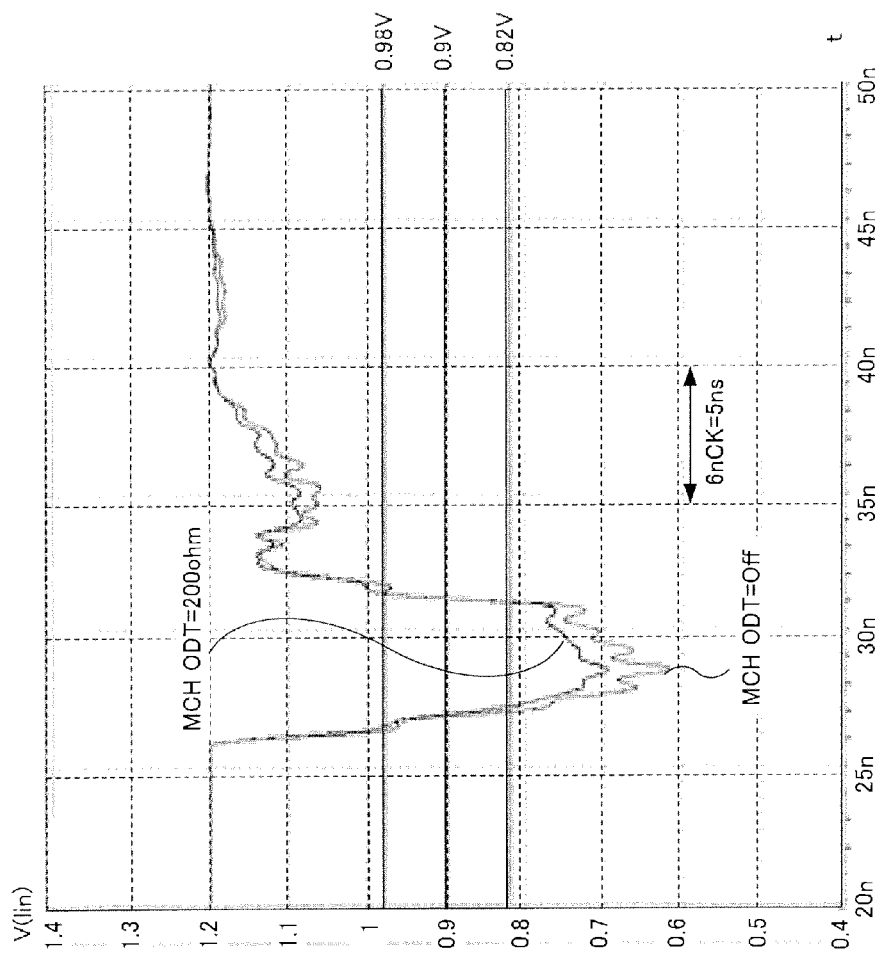
FIG. 18B is a graph showing waveforms of alert signals that are output from the alert terminal of DRAM 200-9 mounted on memory module 100-1 and that are observed by the memory controller in the structure shown in FIG. 9, in the Typical condition, and in the case in which the resistance of the termination resistor of the memory controller is 200 ohms or the termination resistor is not connected to the memory controller.

FIG. 18B shows waveforms of alert signals that are output from alert terminal 201-9 of DRAM 200-9 mounted on memory module 100-1 and that are observed by memory controller 400 in the structure shown in FIG. 9, in the Typical condition, and in the case in which the resistance of the termination resistor of memory controller 400 is 200 ohms or the termination resistor is not connected to memory controller 400.

Figure 18C:
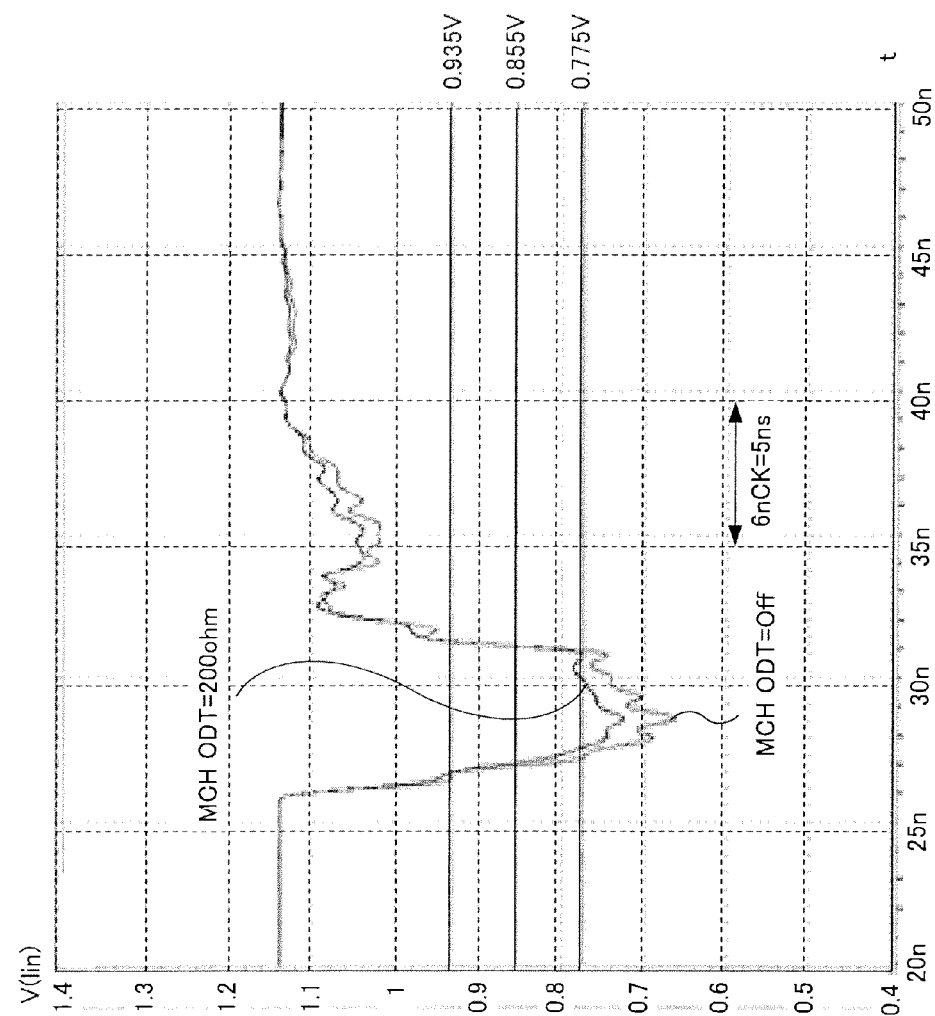
FIG. 18C is a graph showing waveforms of alert signals that are output from the alert terminal of DRAM 200-9 mounted on memory module 100-1 and that are observed by the memory controller in the structure shown in FIG. 9, in the Slow condition, and in the case in which the resistance of the termination resistor of the memory controller is 200 ohms or the termination resistor is not connected to the memory controller.

FIG. 18C shows waveforms of alert signals that are output from alert terminal 201-9 of DRAM 200-9 mounted on memory module 100-1 and that are observed by memory controller 400 in the structure shown in FIG. 9, in the Slow condition, and in the case in which the resistance of the termination resistor of memory controller 400 is 200 ohms or the termination resistor is not connected to memory controller 400.

The results shown in FIGS. 17A to 17C and 18A to 18C reveal that when a termination resistor is not connected to memory controller 400 and the resistance of termination resistor 301 is 50 ohm in the foregoing conditions, memory controller 400 can receive alert signals that satisfy the signal levels of the received signals of memory controller 400 (VIHmin=0.75×VDD+80 mV and VILmax=0.75×VDD−80 mV).

Observed results of waveforms in the structure shown in FIG. 12A are as follows. In this case, the resistance of termination resistor 301 is 50 ohms.

Figure 19A:
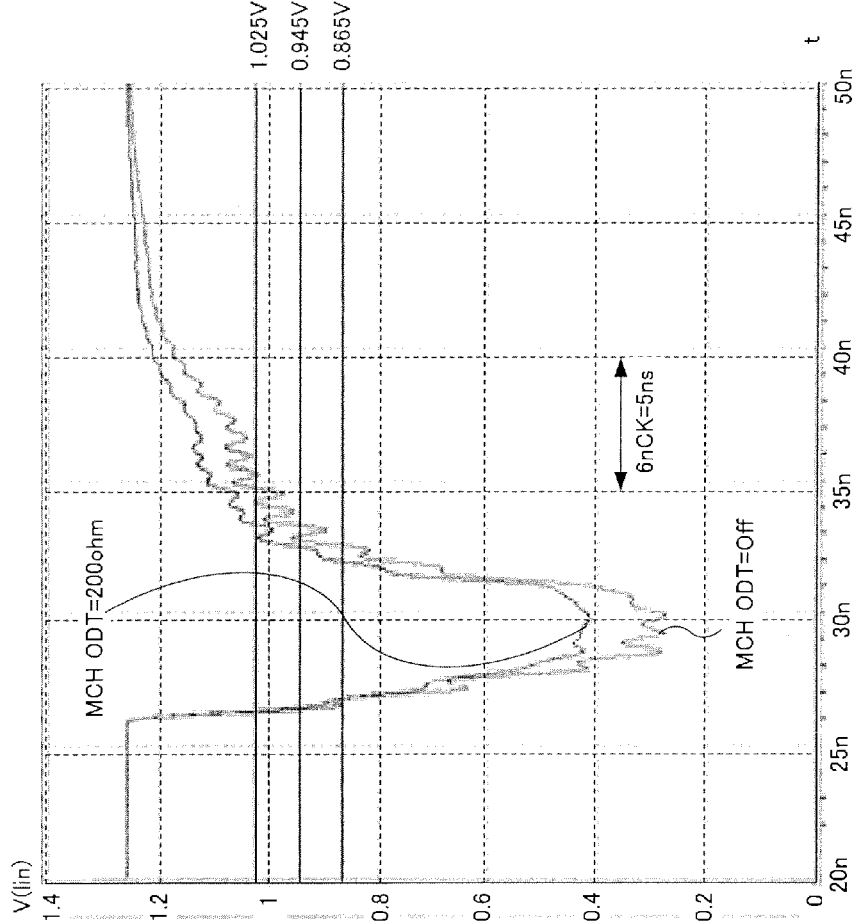
FIG. 19A is a graph showing waveforms of alert signals that are output from the alert terminal of DRAM 200-9 mounted on memory module 100-2 and that are observed by the memory controller in the structure shown in FIG. 12A, in the Fast condition, and in the case in which the resistance of the termination resistor of the memory controller is 200 ohms or the termination resistor is not connected to the memory controller.

FIG. 19A shows waveforms of alert signals that are output from alert terminal 201-9 of DRAM 200-9 mounted on memory module 100-2 and that are observed by memory controller 400 in the structure shown in FIG. 12A, in the Fast condition, and in the case in which the resistance of the termination resistor of memory controller 400 is 200 ohms or the termination resistor is not connected to memory controller 400.

Figure 19B:
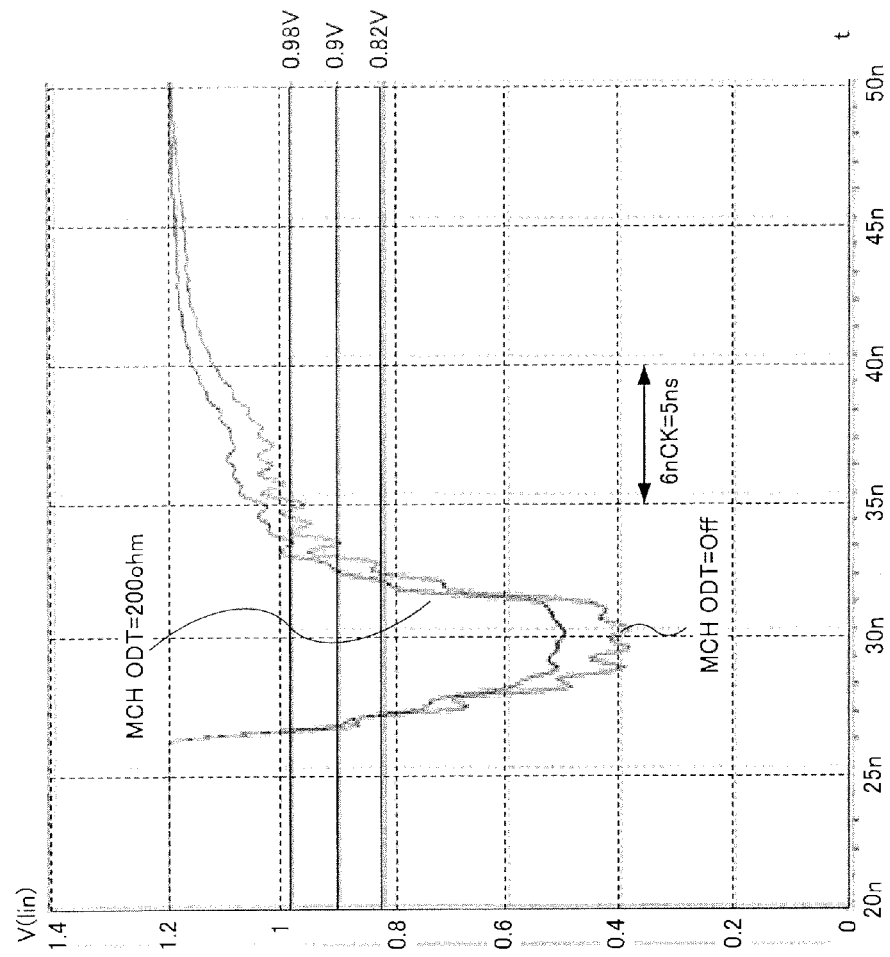
FIG. 19B is a graph showing waveforms of alert signals that are output from the alert terminal of DRAM 200-9 mounted on memory module 100-2 and that are observed by the memory controller in the structure shown in FIG. 12A, in the Typical condition, and in the case in which the resistance of the termination resistor of the memory controller is 200 ohms or the termination resistor is not connected to the memory controller.

FIG. 19B shows waveforms of alert signals that are output from alert terminal 201-9 of DRAM 200-9 mounted on memory module 100-2 and that are observed by memory controller 400 in the structure shown in FIG. 12A, in the Typical condition, and in the case in which the resistance of the termination resistor of memory controller 400 is 200 ohms or the termination resistor is not connected to memory controller 400.

Figure 19C:
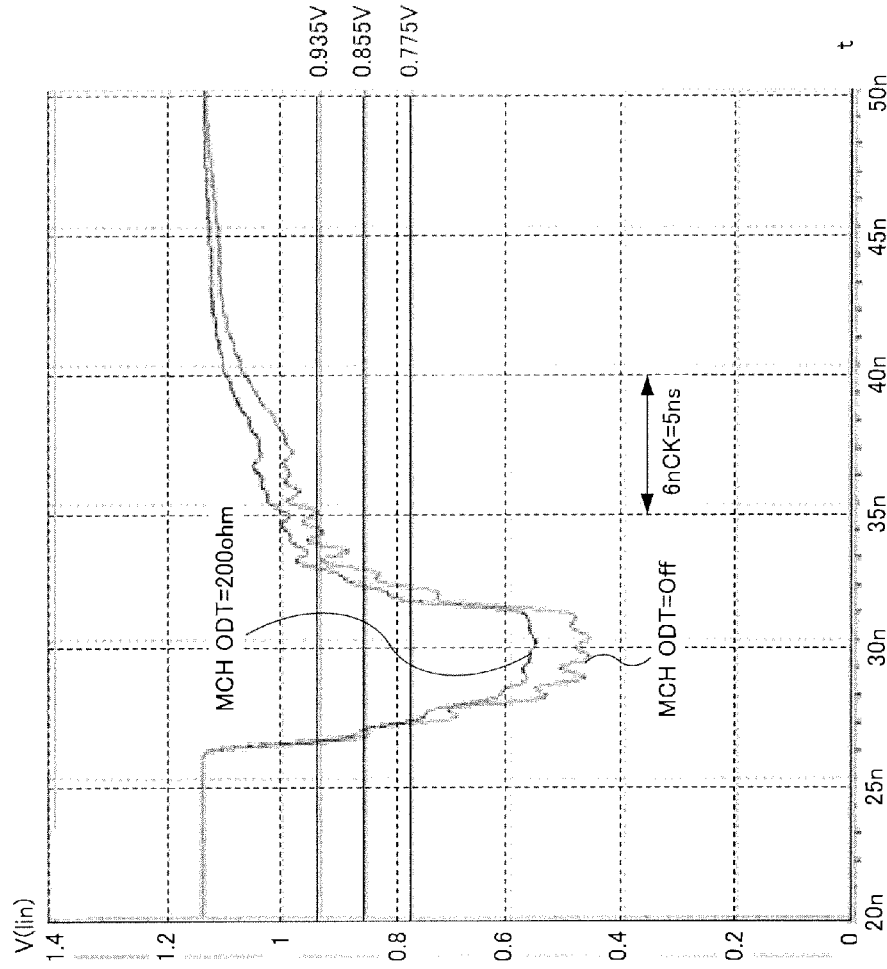
FIG. 19C is a graph showing waveforms of alert signals that are output from the alert terminal of DRAM 200-9 mounted on memory module 100-2 and that are observed by the memory controller in the structure shown in FIG. 12A, in the Slow condition, and in the case in which the resistance of the termination resistor of the memory controller is 200 ohms or the termination resistor is not connected to the memory controller.

FIG. 19C shows waveforms of alert signals that are output from alert terminal 201-9 of DRAM 200-9 mounted on memory module 100-2 and that are observed by memory controller 400 in the structure shown in FIG. 12A, in the Slow condition, and in the case in which the resistance of the termination resistor of memory controller 400 is 200 ohms or the termination resistor is not connected to memory controller 400.

The results shown in FIGS. 19A to 19C reveal that in the foregoing condition and in the state in which the termination resistor of memory controller 400 is not connected or the resistance thereof is 200 ohms, when the resistance of termination resistor 301 is 50 ohms, memory controller 400 can receive alert signals that satisfy signal levels of the received signals of memory controller 400 (VIHmin=0.75×VDD+80 mV and VILmax=0.75×VDD−80 mV).

Second Embodiment

Next, the case in which a memory controller and two memory modules that are SODIMMs are connected in a structure so-called MoBo (Mother Board) T-branch Topology will be described.

Figure 20A:
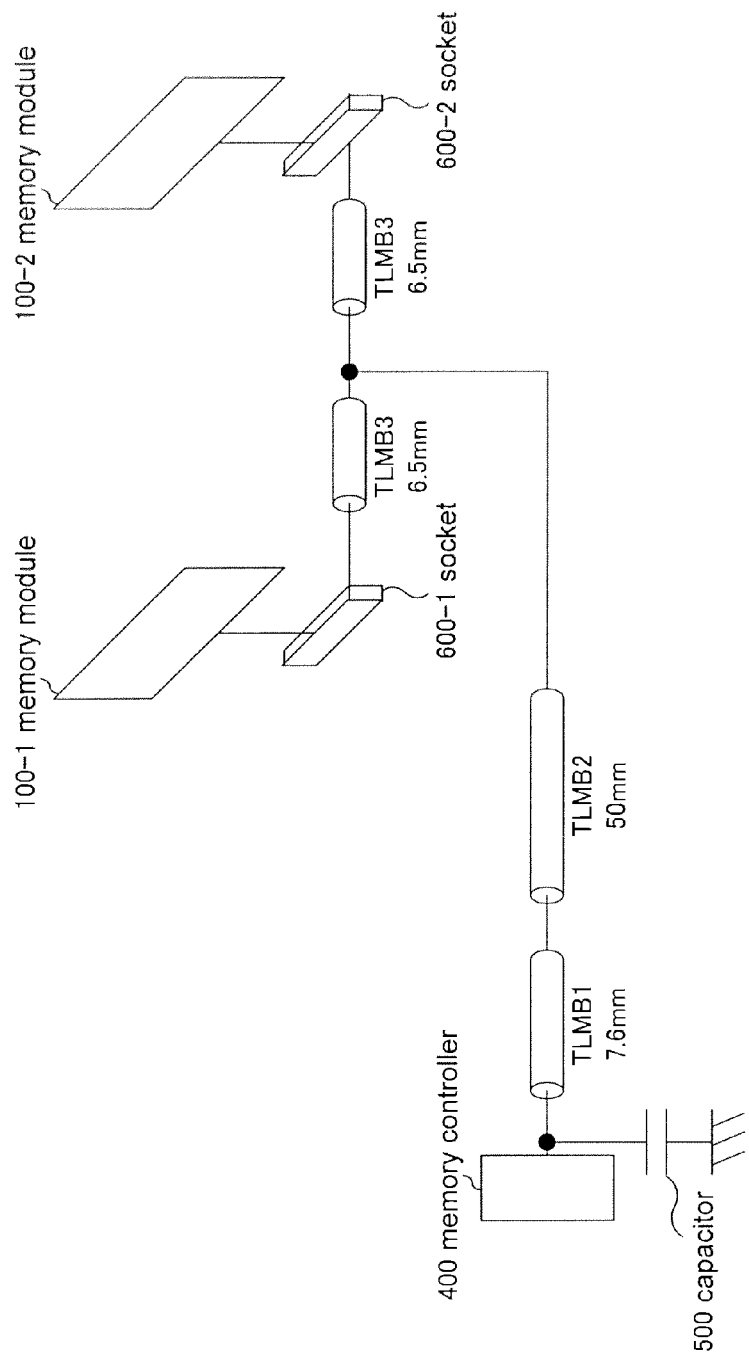
FIG. 20A is a schematic diagram showing an example of the structure of a semiconductor device according to a second embodiment of the present invention.

FIG. 20A shows an example of the structure of a semiconductor device according to a second embodiment of the present invention. With reference to FIG. 20A, two sockets 600-1 to 600-2 are connected through a transmission line. Memory controller 400 is connected nearly at the center of the transmission line. The transmission line is grounded through capacitor 500 in the vicinity of memory controller 400. Memory modules 100-1 to 100-2 are mounted on sockets 600-1 to 600-2, respectively. FIG. 20A shows only a transmission line that transmits alert signals. The structure of each of memory modules 100-1 to 100-2 is the same as that shown in FIG. 3.

Next, connections of the semiconductor device shown in FIG. 20A will be described.

Figure 20B:
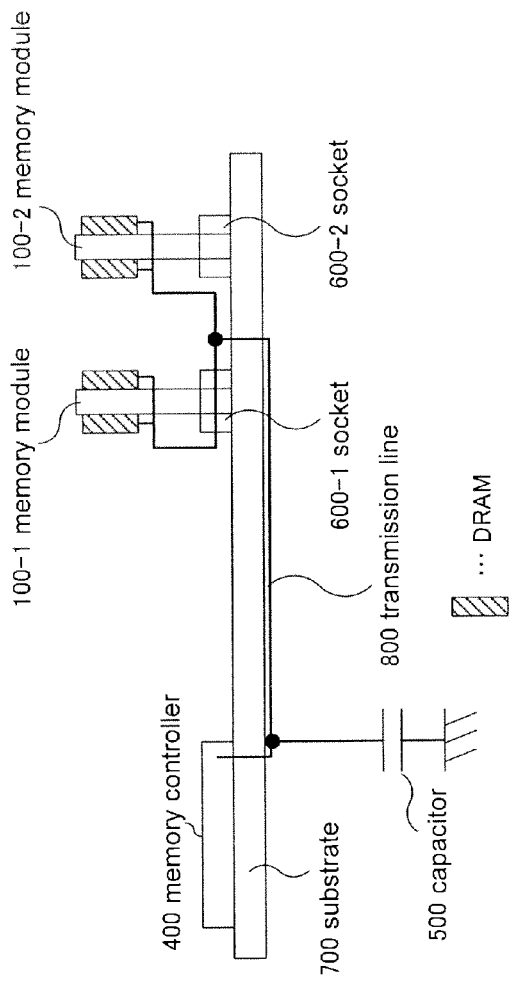
FIG. 20B is a schematic diagram showing connections of the semiconductor device shown in FIG. 20A.

As shown in FIG. 20B, memory controller 400 and sockets 600-1 to 600-2 are mounted on substrate 700. Memory modules 100-1 to 100-2 are mounted on sockets 600-1 to 600-2, respectively. Memory controller 400 and memory modules 100-1 to 100-2, which are mounted on sockets 600-1 to 600-2, respectively, are connected through transmission line 800 having the T-branch Topology structure. A plurality of DRAMs are mounted on each of memory modules 100-1 to 100-2.

In the T-branch Topology structure shown in FIGS. 20A and 20B, the resistance of termination resistor 301 is 50 ohms and the capacitance of capacitor 500 is 30 pF. When two memory modules are mounted on substrate 700, a termination resistor is not connected to memory controller 400. When one memory module is mounted on substrate 700, the resistance of a terminal resistor connected to memory controller 400 is 200 ohms or a terminal resistor is not connected thereto.

Third Embodiment

The case that memory modules are SODIMMs was described. The present invention can be applied to the case in which memory modules are UDIMMs (Unbuffered DIMMs). The structure of each UDIMM is the same as the structure of each SODIMM except for their DIMM sizes.

Figure 21:
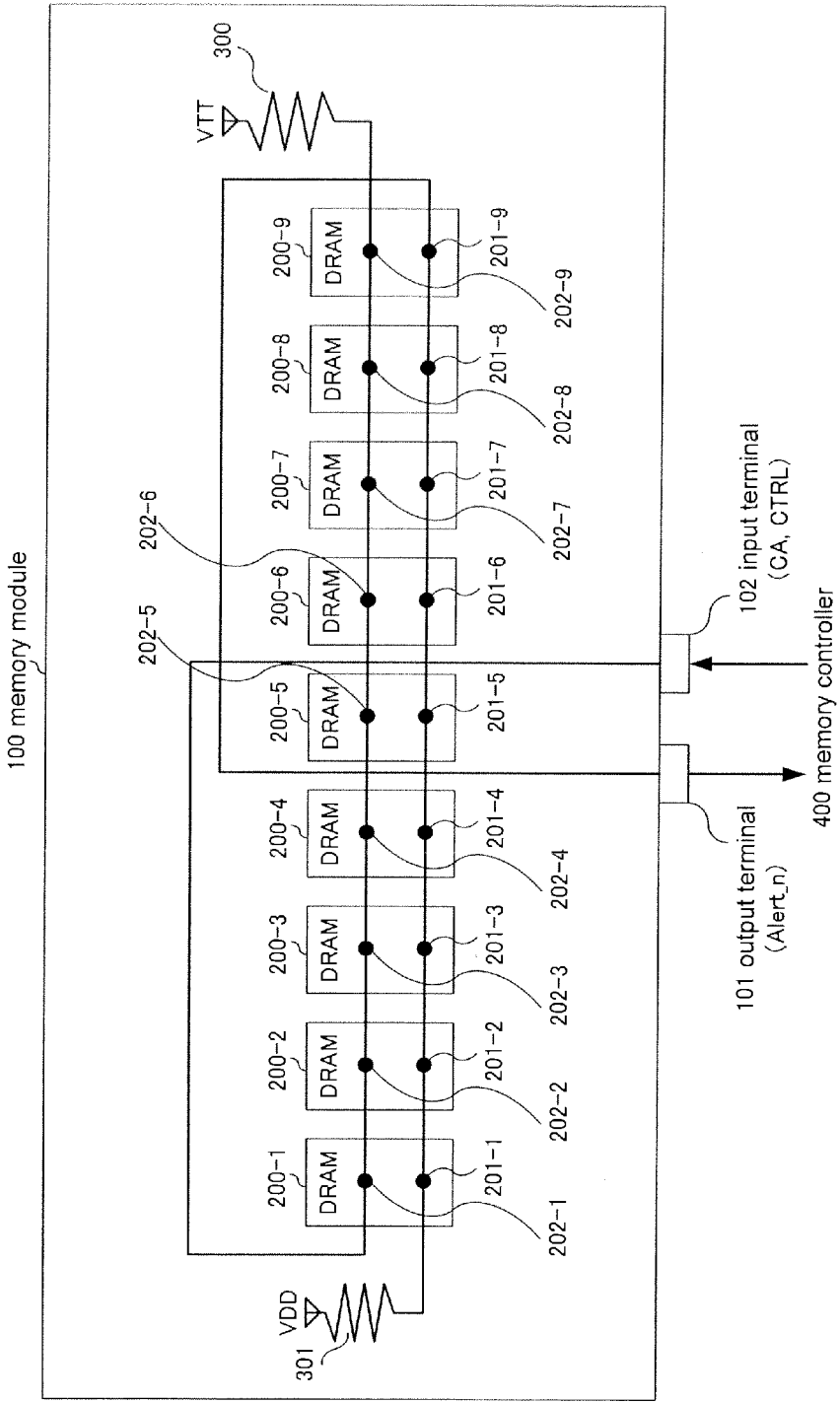
FIG. 21 is a schematic diagram showing the internal structure of memory modules shown in FIG. 2, in which the memory modules are UDIMMs.

FIG. 21 shows the inner structure of memory module 100 shown in FIG. 2, in which the memory module is a UDIMM. When memory module 100 is a UDIMM, a plurality of memory chips DRAMs 200-1 to 200-9 are mounted on memory module 100. Memory module 100 has input terminal 102 that inputs a CA signal and a CTRL signal that are output from memory controller 400. In addition, memory module 100 has output terminal 101 that outputs alert signals that are output from DRAMs 200-1 to 200-9 to memory controller 400. Input terminal 102 and control terminals 202-1 to 202-9 of DRAMs 200-1 to 200-9 are connected in series. Input terminal 102 is connected to termination resistor 300 preceded by DRAM 200-9 that is the farthest from input terminal 102 on the connection line (transmission line). One end of termination resistor 300 is connected to control terminal 202-9, whereas the other end of termination resistor 300 is connected to termination voltage VTT. In addition, output terminal 101 and alert terminals 201-1 to 201-9 of DRAMs 200-1 to 200-9 are connected in series. Output terminal 101 is connected to termination resistor 301 preceded by DRAM 200-1 that is the farthest from output terminal 101 on the connection line (transmission line). One end of termination resistor 301 is connected to alert terminal 201-1, whereas the other end of termination resistor 301 is connected to power supply voltage VDD. FIG. 21 shows the structure of the semiconductor device in which the number of DRAMs is nine. According to the present invention, the number of DRAMs is not limited to nine. The present invention may be applied to UDIMMs, shown in FIG. 21, connected in the structure of Mother Board Fly-by Topology. The resistance of termination resistor 301, the resistance of the termination resistor of memory controller 400, and the capacitance of capacitor 500 of the memory module according to the third embodiment are the same as those according to the first embodiment.

Fourth Embodiment

The present invention may be applied to UDIMMs, shown in FIG. 21, connected in the structure of Mother Board T-Branch Topology. The resistance of termination resistor 301, the resistance of the termination resistor of memory controller 400, and the capacitance of capacitor 500 of the memory module according to the fourth embodiment are the same as those according to the second embodiment.

According to the present invention, distortions of waveforms of alert signals that are output from memory module 100 and that are received by memory controller 400 can be improved.

It is apparent that the present invention is not limited to the above embodiments, but may be modified and changed without departing from the scope and spirit the invention.

The invention claimed is:

1. A system comprising:
a plurality of memory chips each having an alert terminal that notifies that one of the plurality of memory chips having the alert terminal has detected a predetermined error; and
a memory module on which said plurality of memory chips are mounted and that has a first transmission line connected to the alert terminal of each of said plurality of memory chips, an alert signal output terminal connected to one end of said first transmission line, and a first termination resistor having a first end and a second end, said first end being connected to another end of said first transmission line;
a second transmission line having a first end and a second end, said first end being connected to said alert signal output terminal;
a controller connected to said second end of said second transmission line;
a third transmission line that has a first end and a second end, the first end being connected to a first input terminal formed on said memory module and that is connected to a second input terminal that is formed on each of said plurality of memory chips and that inputs a command and address signal and/or a control signal; and
a second termination resistor having a first end and a second end on said memory module, said first end being connected to said second end of said third transmission line,
wherein the second end of the first termination resistor is connected to a first voltage, and
wherein the second end of the second termination resistor is connected to a second voltage which is different from the first voltage.

2. The system as set forth in claim 1,
wherein said plurality of memory chips are arranged in two rows along a longitudinal direction of said memory module.

3. The system as set forth in claim 2,
wherein a number of chips of an upper row of said two rows of said plurality of memory chips is different from a number of chips of a lower row thereof.

4. The system as set forth in claim 1,
wherein said first transmission line is formed from said alert signal output terminal to said first termination resistor clockwise or counterclockwise, and
wherein said third transmission line is formed from said second input terminal to said second termination resistor in a reverse direction of said first transmission line.

5. The system as set forth in claim 1, further comprising:
a fourth transmission line that is formed between said controller and said second input terminal of said memory module and that supplies said command and address signal and/or said control signal from said controller to said second input terminal.

6. The system as set forth in claim 1,
wherein said controller has a third termination resistor connected to said second end of said second transmission line.

7. The system as set forth in claim 6,
wherein said first termination resistor has a resistance that is greater than that of said third termination resistor.

8. The system as set forth in claim 1, further comprising a capacitor having a first end and a second end, the first end being connected to said second transmission line that is connected to said controller, and the second end being connected to a fixed potential.

9. The system of claim 1,
wherein the first voltage is a power supply voltage and the second voltage is a termination voltage.

10. The apparatus of claim 1,
wherein the first voltage is a power supply voltage and the second voltage is a termination voltage.

11. An apparatus comprising:
a memory controller;
a semiconductor device that comprises:
a memory module;
a plurality of memory chips on the memory module, each of the plurality of memory chips having an alert terminal that notifies that one of the plurality of memory chips having the alert terminal has detected a predetermined error;
a first transmission line having a first end and a second end, the first end being coupled to the alert terminal of each of the plurality of memory chips;
an alert signal output terminal coupled to one end of said first transmission line; and
a first termination resistor having a first end and a second end, said first end being connected to the second end of said first transmission line and said second end being connected to a first voltage;
a second transmission line having a first end and a second end, said first end being coupled to said alert signal output terminal and said second end being coupled to said memory controller;
a third transmission line that has a first end and a second end, the first end being connected to a first input terminal formed on said memory module and that is connected to a second input terminal that is formed on each of said plurality of memory chips and that inputs a command and address signal and/or a control signal; and
a second termination resistor having a first end and a second end on said memory module, said first end being connected to said second end of said third transmission line and said second end being connected to a second voltage which is different from the first voltage.

12. The apparatus of claim 11, wherein the capacitor is connected to the controller.

13. The apparatus of claim 11,
wherein said first transmission line is formed from said alert signal output terminal to said first termination resistor clockwise or counterclockwise, and
wherein said third transmission line is formed from said second input terminal to said second termination resistor in a reverse direction of said first transmission line.

14. The apparatus of claim 11,
wherein said plurality of memory chips are arranged in two rows along a longitudinal direction of said memory module.

15. The apparatus of claim 14,
wherein a number of chips of an upper row of said two rows of said plurality of memory chips is different from a number of chips of a lower row thereof.

16. The system of claim 9,
wherein the first voltage is higher than the second voltage.

17. The system of claim 16,
wherein the second voltage is approximately half the first voltage.

18. The apparatus of claim 10,
wherein the first voltage is higher than the second voltage.

19. The apparatus of claim 18,
wherein the second voltage is approximately half the first voltage.

* * * * *